United States Patent
Suh et al.

(10) Patent No.: US 7,335,590 B2
(45) Date of Patent: Feb. 26, 2008

(54) METHOD OF FABRICATING SEMICONDUCTOR DEVICE BY FORMING DIFFUSION BARRIER LAYER SELECTIVELY AND SEMICONDUCTOR DEVICE FABRICATED THEREBY

(75) Inventors: Bong-Seok Suh, Suwon-si (KR);
Ki-Chul Park, Suwon-si (KR);
Seung-Man Choi, Hwaseong-si (KR);
Il-Ryong Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 315 days.

(21) Appl. No.: 11/033,189

(22) Filed: Jan. 11, 2005

(65) Prior Publication Data

US 2005/0153544 A1   Jul. 14, 2005

(30) Foreign Application Priority Data

Jan. 12, 2004   (KR) ...................... 10-2004-0002081

(51) Int. Cl.
*H01L 21/4763* (2006.01)

(52) U.S. Cl. .............................. 438/643; 257/E21.161; 257/E21.584; 438/712

(58) Field of Classification Search ................ 438/712, 438/713, 738, 720, 643; 257/E21.161, E21.584
See application file for complete search history.

(56) References Cited

U.S. PATENT DOCUMENTS

| | | | | |
|---|---|---|---|---|
| 6,077,767 A | 6/2000 | Hwang | ........................ | 438/619 |
| 6,077,769 A | 6/2000 | Huang et al. | ................ | 438/622 |
| 6,383,912 B1 * | 5/2002 | Chung et al. | ................ | 438/624 |
| 6,531,390 B2 | 3/2003 | Chooi et al. | | |
| 6,541,374 B1 * | 4/2003 | de Felipe et al. | ............ | 438/648 |
| 6,559,061 B2 | 5/2003 | Hashim et al. | .............. | 438/722 |
| 6,566,258 B1 | 5/2003 | Dixit et al. | | |
| 6,607,977 B1 * | 8/2003 | Rozbicki et al. | ............ | 438/627 |
| 6,680,247 B2 | 1/2004 | Ueno | | |
| 2002/0072226 A1 | 6/2002 | Ueno | | |
| 2004/0137714 A1 * | 7/2004 | Friedemann et al. | ........ | 438/627 |

FOREIGN PATENT DOCUMENTS

| | | |
|---|---|---|
| JP | 10-92924 | 4/1998 |
| JP | 2002-151516 | 5/2002 |
| JP | 2002-176099 | 6/2002 |

* cited by examiner

*Primary Examiner*—Caridad Everhart
(74) *Attorney, Agent, or Firm*—Mills & Onello LLP

(57) ABSTRACT

In a method of fabricating a semiconductor device by selectively forming a diffusion barrier layer, and a semiconductor device fabricated thereby, a conductive pattern and an insulating layer, which covers the conductive pattern, are formed on a semiconductor substrate. The insulating layer is patterned, thereby forming an opening for exposing at least a portion of the conductive pattern. Then, a diffusion barrier layer is formed on the semiconductor substrate having the opening, using a selective deposition technique. The diffusion barrier layer is formed to a thickness that is less on the exposed conductive pattern than the thickness of the diffusion barrier layer on the insulating layer exposed inside the opening. Then, the diffusion barrier layer is etched, thereby forming a recessed diffusion barrier layer. In this manner, metal atoms are prevented from being diffused from a metal plug filling the opening or a metal interconnect to the insulating layer.

40 Claims, 19 Drawing Sheets

METHOD OF FABRICATING SEMICONDUCTOR DEVICE BY FORMING DIFFUSION BARRIER LAYER SELECTIVELY AND SEMICONDUCTOR DEVICE FABRICATED THEREBY

CROSS-REFERENCE TO RELATED APPLICATION

This application claims the benefit of Korean Patent Application No. 2004-2081, filed Jan. 12, 2004, the disclosure of which is hereby incorporated herein by reference in its entirety.

BACKGROUND

1. Technical Field

The present invention relates to a method of fabricating a semiconductor device and a semiconductor device fabricated thereby and, more particularly, to a method of fabricating a semiconductor device by forming a diffusion barrier layer selectively and a semiconductor device fabricated thereby.

2. Discussion of the Related Art

With the trend toward an ever-increasing level of integration in semiconductor devices, the technology of multi-layered metal interconnects has become widely employed. In particular, multi-layered metal interconnects are preferably formed of a metal layer having low resistivity and high reliability, in order to improve the performance of the semiconductor device. A copper layer is generally used for the metal layer. However, it is difficult to pattern the copper layer through a typical photolithography process. Therefore, a damascene process is widely used as a technology for patterning the copper layer.

The damascene process is widely used to form an upper interconnect, which is electrically connected to a lower interconnect. The upper interconnect fills a groove formed inside an interlayer insulating layer. The groove is formed across an upper surface of a metal plug by patterning the interlayer insulating layer using a photolithography process. Further, the damascene process is used to form the metal plug. That is, a via hole is formed to expose a predetermined portion of the lower interconnect, and the metal plug is formed to fill the via hole. This damascene process of forming the metal plug and the upper interconnect is referred to as a "single" damascene process.

Alternatively, a damascene process can be used to form the metal plug and the upper interconnect at the same time. That is, a via hole, which exposes a predetermined portion of the lower interconnect, and a groove, which intersects an upper portion of the via hole, are formed at the same time. An upper interconnect is formed to fill the via hole and the groove. This damascene process is referred to as a "dual" damascene process.

Further, copper atoms have a high diffusion rate into an adjacent insulating layer or silicon layer. Thus, during the damascene process, the copper atoms are diffused into the insulating layer, thereby causing a leakage current, and are diffused into an active elements such as a transistor, thereby operating as impurities. Therefore, it is necessary to form a diffusion barrier layer in order to limit diffusion of copper from the copper layer forming the metal plug and/or the upper interconnect. The diffusion barrier layer prevents the copper atoms from being diffused into the insulating layer. However, the diffusion barrier layer, which is interposed between the lower interconnect and the metal plug and/or between the upper interconnect and the metal plug, increases via resistance.

A method of decreasing via resistance by removing a diffusion barrier layer between a metal plug and an interconnect layer is disclosed in U.S. Pat. No. 6,559,061, "Method and apparatus for forming improved metal interconnects" to Hashim, et al. The method disclosed by Hashim, et al. includes a process of depositing a diffusion barrier layer inside a hole confined inside an insulating layer on a copper feature. The process includes a deposition of a diffusion barrier layer on the surface of the hole. The diffusion barrier layer and the naturally formed oxide layer on at least one portion of the copper feature are removed, thereby exposing the at least one portion of the copper feature. According to the method, the diffusion barrier layer is formed on the surface of the holes, and the diffusion barrier layer is removed on the copper feature under the hole. As a result, the copper layer filling the hole and the copper feature are in direct contact with each other, thereby reducing via resistance.

However, the method is difficult to employ when forming the upper interconnects using the single damascene process. That is, the diffusion barrier layer is deposited inside a groove confined into the insulating layer on the metal plug. Then, the diffusion barrier layer on the metal plug is removed, thereby exposing the metal plug. At this time, the insulating layer adjacent to the metal plug is also exposed. Then, a copper interconnect is formed to fill the groove. The copper interconnect is in direct contact with the insulating layer adjacent to the metal plug. Thus, copper atoms can be diffused from the copper interconnect filling the groove into the insulating layer adjacent the metal plug.

Further, with increased integration semiconductor devices, the line width of the metal interconnect is reduced. The reduction of the line width of the lower interconnect leads to a size reduction in the via hole. The reduction of the line width of the lower interconnect reduces the process margin for aligning the via hole with the lower interconnect. Thus, the via hole can be formed at a lateral position that is beyond the width of the lower interconnect, thereby exposing the insulating layer adjacent to the lower interconnect. As a result, an unlanded via is formed, in which the metal plug makes contact with the insulating layer adjacent to the lower interconnect. The unlanded via is more likely to be formed when the size of the via hole cannot be further reduced, despite the reduction of the line width of the metal interconnect due to the higher integration. Thus, it is necessary to form a diffusion barrier layer for preventing metal atoms from being diffused into the insulating layer adjacent to the lower interconnect from the metal plug. However, the diffusion barrier layer cannot be formed between the metal plug and the insulating layer adjacent to the lower interconnect according to the method disclosed in the U.S. Pat. No. 6,559,061. Therefore, the method disclosed in the U.S. Pat. No. 6,559,061 does not provide a solution which leads to a reduction of via resistance and, at the same time, prevents diffusion of copper atoms when forming the copper interconnect using a single damascene process. Further, the process does not prevent metal atoms from being diffused from an unlanded via into the insulating layer adjacent the lower interconnect.

SUMMARY OF THE INVENTION

Therefore, the present invention is directed to provide a method of fabricating a semiconductor device for preventing the diffusion of metal atoms, while minimizing resulting via resistance.

Another object of the present invention is to provide a semiconductor device for preventing the diffusion of metal atoms, while minimizing via resistance.

In one aspect, the present invention is directed to a method of fabricating a semiconductor device by selectively forming a diffusion barrier layer. The method includes forming a conductive pattern and an insulating layer, which covers the conductive pattern, on a semiconductor substrate. By patterning the insulating layer, an opening for exposing at least a portion of the conductive pattern is formed. Then, a diffusion barrier layer is formed in the opening, using a selective deposition technique. The diffusion barrier layer is formed to have a thickness that is less on the exposed conductive pattern than the thickness of the diffusion barrier layer on the insulating layer exposed inside the opening. A recessed diffusion barrier layer is formed by etching the diffusion barrier layer.

The opening may expose an interface of the conductive pattern and the insulating layer such that a portion of the insulating layer is disposed on a bottom of the opening.

Preferably, the conductive pattern may include W, Al or Cu principally. While forming the conductive pattern, a barrier metal layer may be formed between sidewalls of the conductive pattern and the insulating layer. The barrier metal layer may be exposed through the opening.

Preferably, the diffusion barrier layer may be formed with a thickness in the range of 30 to 300 Å on the surface of the insulating layer, which is exposed inside the opening, and more preferably, it may be formed with a thickness in the range of 50 to 200 Å. The diffusion barrier layer is preferably formed using a chemical vapor deposition (CVD) technology or an atomic layer deposition (ALD) technology. The diffusion barrier layer preferably includes a metal nitride layer such as a tantalum (Ta) layer, a tantalum nitride (TaN) layer, a titanium nitride (TiN) layer, and a tungsten nitride (WN) layer, or a metal silicon nitride layer such as a tantalum silicon nitride (TaSiN) layer, a titanium silicon nitride (TiSiN) layer, and a tungsten silicon nitride (WSiN) layer. The metal silicon nitride layer may be formed by forming the metal nitride layer and surface-treating the layer.

A method of selectively depositing a TiN material using the CVD technology is disclosed in U.S. Pat. No. 6,541,374, "Method of depositing a diffusion barrier for copper interconnection application", by de Felipe et. al, incorporated herein by reference with this invention except a deposition thickness. A detailed explanation on this technology will be explained below in conjunction with the embodiments of the present invention.

Further, the recessed diffusion barrier layer may be thicker in thickness on the insulating layer disposed on a bottom of the opening than on the exposed conductive pattern, and thicker in thickness on inner sidewalls of the opening than on the insulating layer disposed on the bottom of the opening. The recessed diffusion barrier layer on the insulating layer disposed on the bottom of the opening preferably has a thickness of 10 to 100 Å. Further, during the etching of the diffusion barrier layer, the diffusion barrier layer on the exposed conductive pattern may be completely removed. Also, it is preferable to remove a natural oxide layer on the conductive pattern.

In the case that at least a portion of the diffusion barrier layer is exposed, the diffusion barrier layer on the barrier metal layer may be thicker in thickness than the diffusion barrier layer on the conductive pattern. The recessed diffusion barrier layer may still cover the barrier metal layer. Thus, copper atoms can be prevented from being diffused along an interface of the barrier metal layer and the insulating layer.

Preferably, the etching operation of the diffusion barrier layer to form the recessed diffusion barrier layer may be performed using a typical reactive ion etch (RIE) technology, or an Ar plasma etching technology. Etching the diffusion barrier layer, and sequentially forming the seed layer and the Cu plated layer, the opening may be filled. Thus, a thickness of the diffusion barrier layer interposed between the Cu plated layer and the conductive pattern can be minimized, and a via resistance can be minimized. Further, before forming the seed layer, an adhesion layer may be formed. The adhesion layer improves an adhesion force of the seed layer and the Cu plated layer. The adhesion layer may be composed of Ta, Ti, Ru, Co or W.

Further, when etching the diffusion barrier layer, the seed layer may be concurrently formed. That is, the seed layer may be formed on the semiconductor substrate having the diffusion barrier layer formed thereon, using an ionized physical vapor deposition (i-PVD) technology including deposition/etching. While forming the seed layer using the i-PVD technology, the ionized seed material etches the diffusion barrier layer, thereby forming a recessed diffusion barrier layer. Then, the Cu plated layer may be formed on the semiconductor substrate having the seed layer formed thereon.

Alternatively, while etching the diffusion barrier layer, the adhesion layer may be concurrently formed. The adhesion layer may be formed using the i-PVD technology. While forming the adhesion layer using the i-PVD technology, the ionized adhesion material etches the diffusion barrier layer, and recesses the layer. Then, the seed layer and the Cu plated layer may be sequentially formed on the semiconductor substrate having the adhesion layer formed thereon.

According to another aspect of the present invention, exemplary embodiments of the present invention provide a method of fabricating a semiconductor device by selectively forming a diffusion barrier layer. The method includes forming a first insulating layer on a semiconductor substrate. A metal plug is formed inside the first insulating layer. Then, a second insulating layer is formed on the first insulating layer and the metal plug, and the second insulating layer is patterned, thereby forming a groove, which exposes the metal plug and the first insulating layer. A diffusion barrier layer is conformally formed on the whole surface of the semiconductor substrate having the groove, using a selective deposition technology. The diffusion barrier layer on the exposed metal plug is formed to a thickness that is less than the thickness of the diffusion barrier layer on the first and the second insulating layers. Then, the diffusion barrier layer is etched, thereby forming a recessed diffusion barrier layer.

Preferably, the metal plug may be an Al, W, or Cu plug. While forming the metal plug, a barrier metal layer may be formed with interposed between the metal plug and the first insulating layer. The barrier metal layer may be exposed through the opening.

Preferably, the diffusion barrier layer may be formed with a thickness of 30 to 300 Å on the surface of the exposed first insulating layer and the surface of the second insulating layer, and more preferably, it may be formed with a thickness of 50 to 200 Å. Preferably, the diffusion barrier layer may be formed using a CVD technology or an ALD technology.

Further, the recessed diffusion barrier layer may be thicker in thickness on the first insulating layer than on the exposed metal plug, and may be thicker in thickness on the second insulating layer than on the first insulating layer. The recessed diffusion barrier layer on the first insulating layer may be formed with a thickness of 10 to 100 Å. While etching the diffusion barrier layer, the diffusion barrier layer on the metal plug may be completely removed. Preferably, a natural oxide layer on the metal plug may be removed.

According to a still another aspect of the present invention, exemplary embodiments of the present invention provide a method of fabricating a semiconductor device by selectively forming a diffusion barrier layer. The method includes forming a lower interconnect and a first insulating layer at the sidewalls of at least the lower interconnect on a semiconductor substrate. Then, a second insulating layer is formed on the first insulating layer and the lower interconnect, and patterning the second insulating layer, thereby forming a via hole for exposing an interface of the sidewall of the lower interconnect and the first insulating layer. A diffusion barrier layer is conformally formed on the overall surface of the semiconductor substrate having the via hole using a selective deposition technology. The diffusion barrier layer is formed to have a thickness that is less on the exposed lower interconnect than the thickness on the first and the second insulating layers. Then, the diffusion barrier layer is etched, thereby forming a recessed diffusion barrier layer.

Preferably, the lower interconnect may be composed of Al, Cu, or W. While forming the lower interconnect, a barrier metal layer may be interposed between the lower interconnect and the first insulating layer. The barrier metal layer may be exposed through the opening.

Preferably, the diffusion barrier layer may be formed with a thickness of 30 to 300 Å on the surface of the exposed first insulating layer and the surface of the second insulating layer, and more preferably, it may be formed with a thickness of 50 to 200 Å. Preferably, the diffusion barrier layer may be formed using a chemical vapor deposition (CVD) technology or an atomic layer deposition (ALD) technology.

Further, the recessed diffusion barrier layer may be thicker in thickness on the first insulating layer than on the exposed lower interconnect, and may be thicker in thickness on the second insulating layer than on the first insulating layer. The recessed diffusion barrier layer on the first insulating layer may be formed with a thickness of 10 to 100 Å. While the diffusion barrier layer is etched, the diffusion barrier layer on the lower interconnect may be completely removed. Preferably, a natural oxide layer on the exposed lower interconnect may be removed.

According to a further aspect of the present invention, exemplary embodiments of the present invention provide a semiconductor device fabricated by selectively forming a diffusion barrier layer. The semiconductor device includes a semiconductor substrate. A metal plug is disposed on the semiconductor substrate. A metal interconnect is disposed on a top of the metal plug. A first insulating layer extends at sidewalls of the metal plug, and is disposed between the metal interconnect and the semiconductor substrate. Further, a second insulating layer is at sidewalls of the metal interconnect. A diffusion barrier layer is disposed between the metal interconnect and the second insulating layer, between the metal interconnect and the first insulating layer, and between the metal interconnect and the metal plug. The diffusion barrier layer, which is interposed between the metal interconnect and the metal plug, is of a thickness that is less than the thickness of the diffusion barrier layer, which is interposed between the metal interconnect and the first insulating layer.

The diffusion barrier layer interposed between the metal interconnect and the first insulating layer may be thinner in thickness than the diffusion barrier layer interposed between the metal interconnect and the second insulating layer. Further, the diffusion barrier layer, which is interposed between the metal interconnect and the metal plug, may be continuous or discontinuous.

Alternatively, the diffusion barrier layer may not be interposed between the metal interconnect and the metal plug. As a result, an interface resistance between the metal interconnect and the metal plug can be minimized.

According to a still further aspect of the present invention, exemplary embodiments of the present invention provide a semiconductor device fabricated by selectively forming a diffusion barrier layer. The semiconductor device includes a semiconductor substrate. A lower interconnect is disposed on the semiconductor substrate. A first insulating layer is at the sidewalls of the lower interconnect. A metal plug is disposed on the interface of the lower interconnect and the first insulating layer. The metal plug is disposed on a region including a portion of the first insulating layer and a portion of the lower interconnect. A second insulating layer is at the sidewalls of the metal plug. Further, a diffusion barrier layer is disposed between the metal plug and the second insulating layer, between the metal plug and the first insulating layer, and between the metal plug and the lower interconnect. The diffusion barrier layer, which is interposed between the metal plug and the lower interconnect, is of a thickness that is less than thickness than the diffusion barrier layer that is interposed between the metal plug and the first insulating layer.

The diffusion barrier layer interposed between the metal plug and the first insulating layer may be thinner in thickness than the diffusion barrier layer interposed between the metal plug and the second insulating layer. Further, the diffusion barrier layer, which is interposed between the metal plug and the lower interconnect, may be continuous or discontinuous.

Alternatively, the diffusion barrier layer may not be interposed between the metal plug and the lower interconnect. As a result, an interface resistance between the metal plug and the lower interconnect can be minimized.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
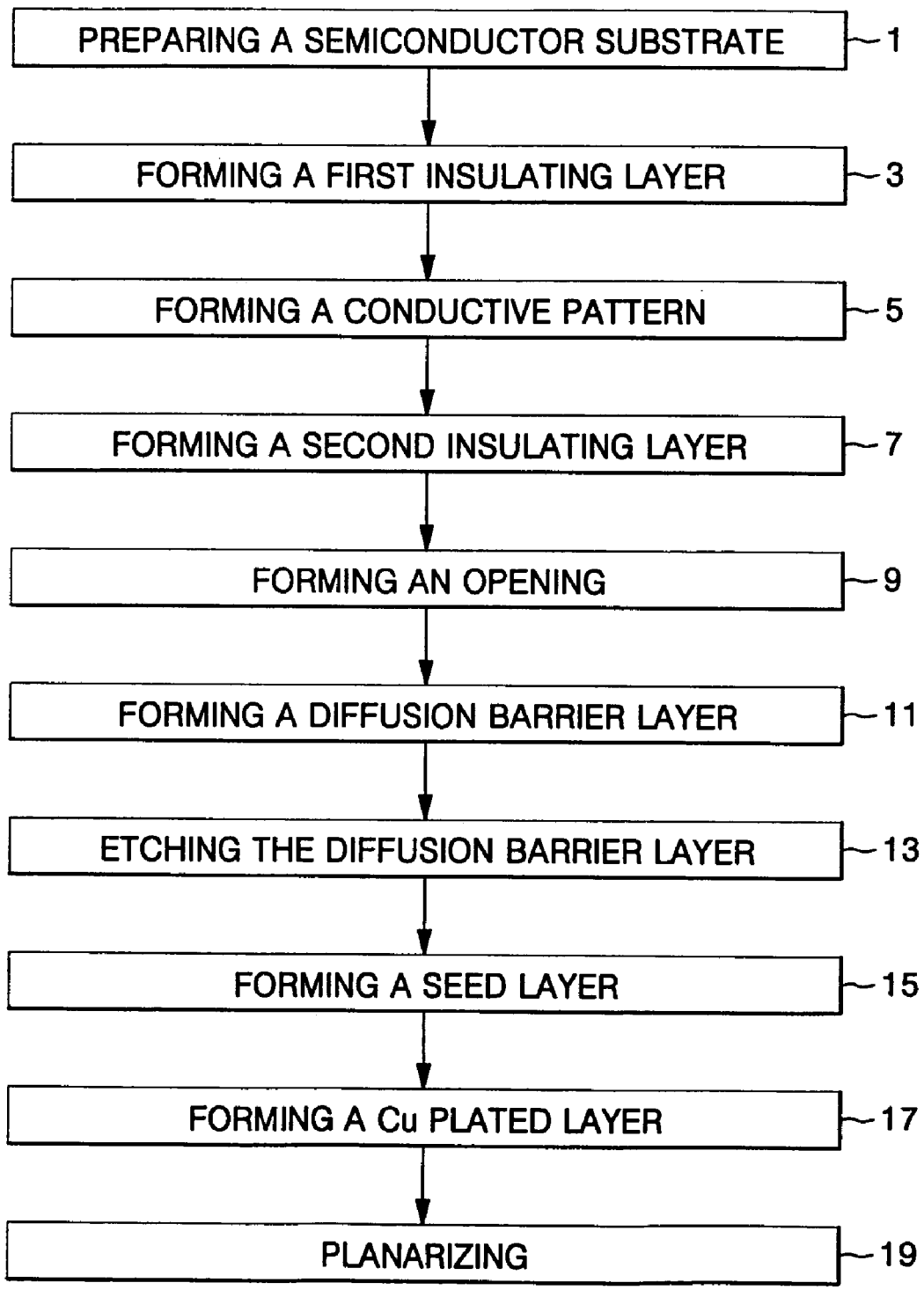
FIG. 1 is a flow chart of a processing sequence illustrating a method of fabricating a semiconductor device according to the embodiments of the present invention.

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

FIG. 1 is a flow chart of processing sequences illustrating a method of fabricating a semiconductor device according to embodiments of the present invention, and FIGS. 2 to 10 are schematic sectional views illustrating a method of fabricating a semiconductor device using a single damascene process according to an embodiment of the present invention.

Figure 2:
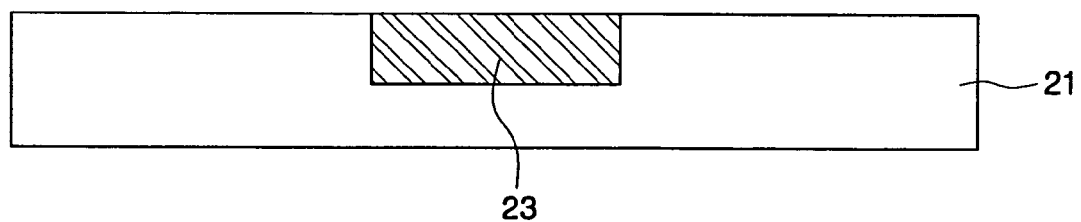
FIGS. 2 to 10 are schematic sectional views illustrating a method of fabricating a semiconductor device using a single damascene process according to an embodiment of the present invention.

Referring to FIGS. 1 and 2, a semiconductor substrate 21 having a lower conductive pattern 23 is prepared (step 1 of FIG. 1). The lower conductive pattern 23 may be a source region, a drain region, a gate electrode, or a bit line, for example. Further, the lower conductive pattern 23 may be an upper electrode of a capacitor or a lower interconnect. The lower conductive pattern 23 is formed, for example, using a typical photolithography process or a damascene process.

Figure 3:
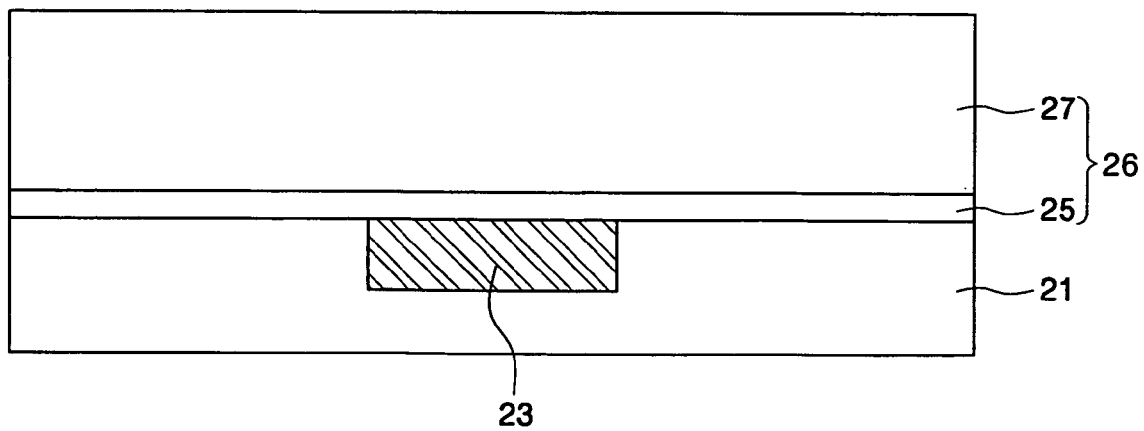

Referring to FIGS. 1 and 3, a first insulating layer 26 is formed on the semiconductor substrate 21 (step 3 of FIG. 1). The first insulating layer 26 may include a lower etch stop layer 25 and a lower interlayer insulating layer 27, which are sequentially stacked, and may further include a hard mask layer (not shown) on the lower interlayer insulating layer 27. The lower etch stop layer 25 may be formed to protect the lower conductive pattern 23 while the lower interlayer insulating layer 27 is etched, or to prevent atoms from being diffused from the lower conductive pattern 23. The lower etch stop layer 25 is preferably composed of silicon nitride (SiN), silicon carbon (SiC), or silicon carbon nitride (SiCN). The lower interlayer insulating layer 27 is preferably formed of a low-k dielectric layer.

Figure 4:
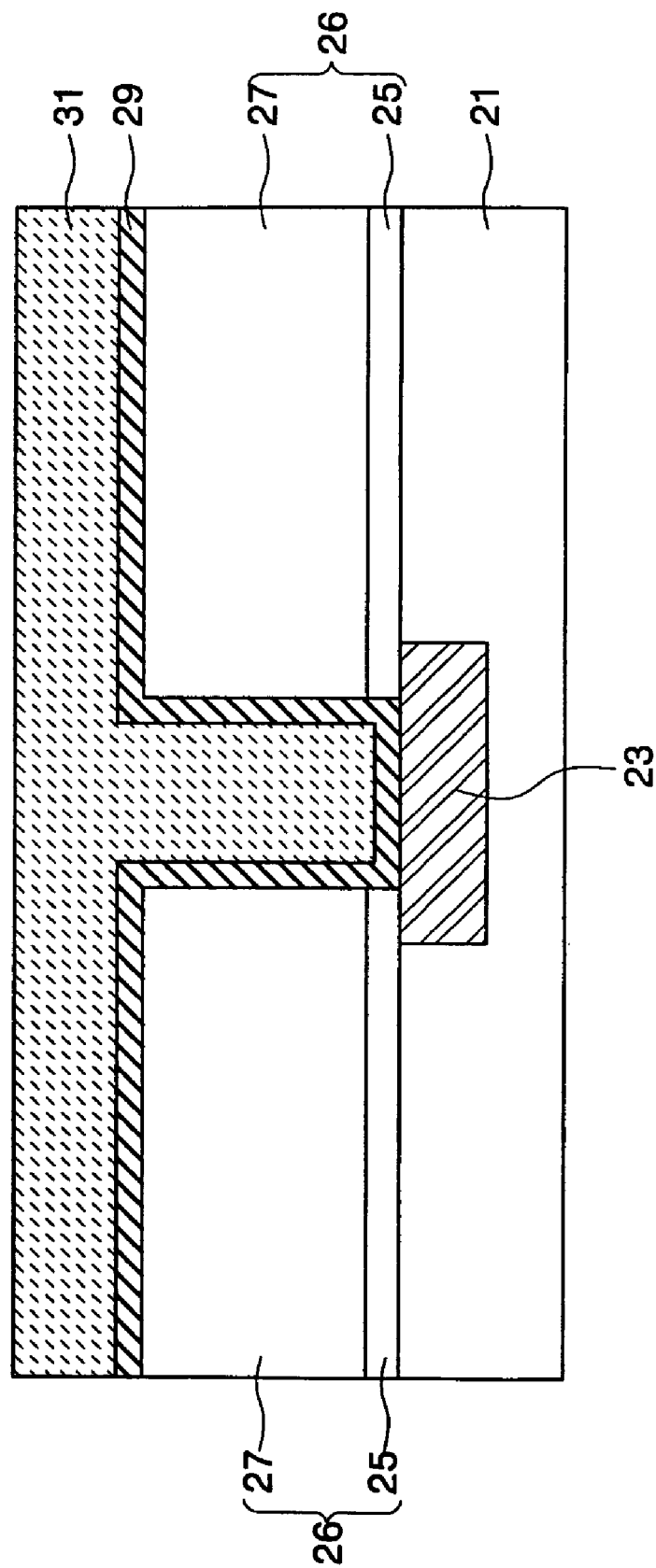

Referring to FIGS. 1 and 4, the first insulating layer 26 is patterned using a photolithography process, thereby forming a contact hole or a via hole for exposing the lower conductive pattern 23.

Then, a metal layer 31, which fills the contact hole or the via hole, is formed. The metal layer 31 may be a material layer principally including Al, Cu or W. Preferably, before forming the metal layer 31, a barrier metal layer 29 may be formed. The barrier metal layer 29 may be composed of a material generally employed in accordance with the metal layer 31, and may be formed of multi-layers. The barrier metal layer 29 may be formed using a physical vapor deposition (PVD) technology or a chemical vapor deposition (CVD) technology, or using both of these technologies.

Figure 5:
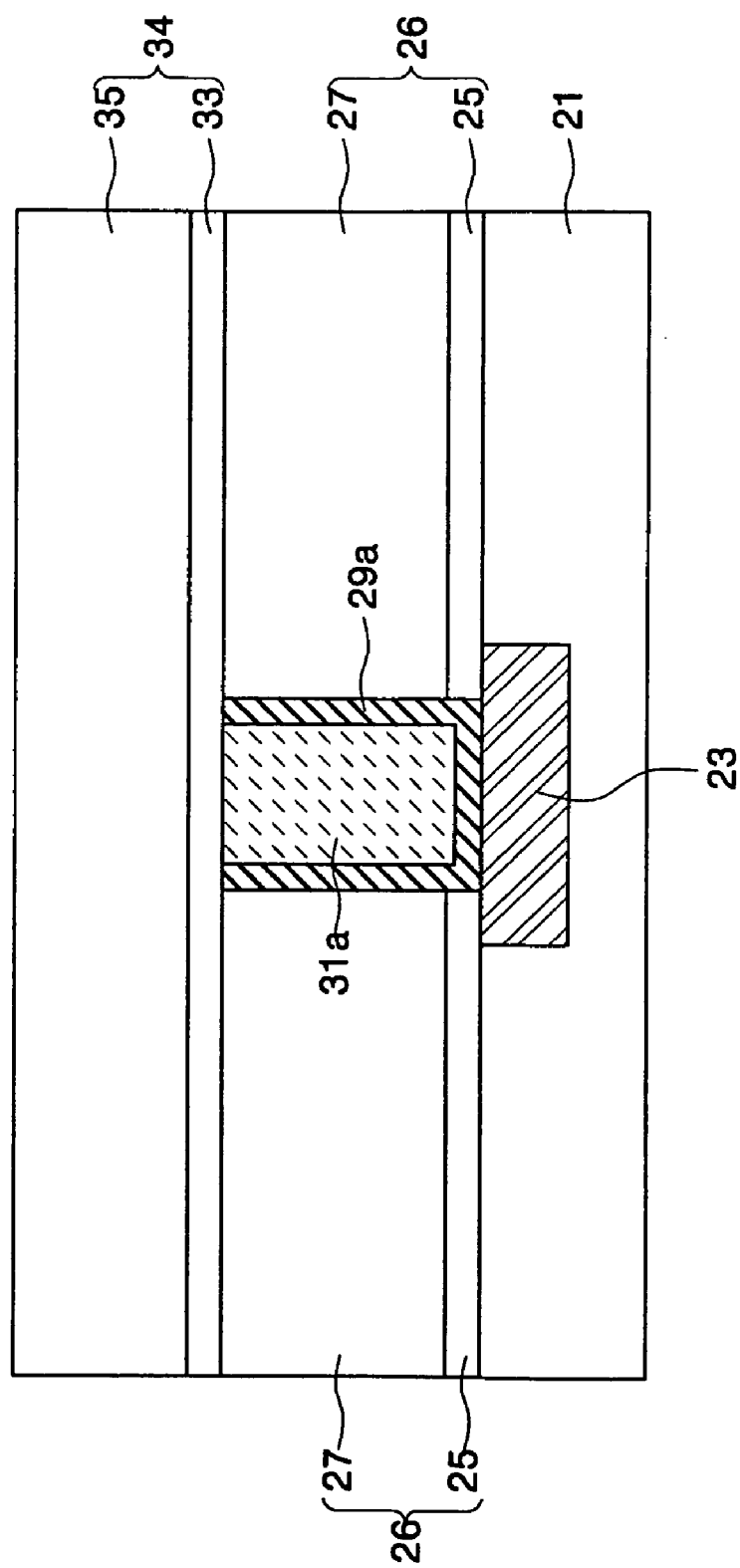

Referring to FIGS. 1 and 5, the metal layer 31 and the barrier metal layer 29 are planarized until an upper surface of the first insulating layer 26 is exposed. As a result, a barrier metal layer 29a and a metal plug 31a (conductive pattern of FIG. 1) are confined inside the contact hole or the via hole (step 5 of FIG. 1). The metal layer 31 and the barrier metal layer 29 may be planarized using an overall-surface etching technology or a chemical mechanical polishing (CMP) technology.

A second insulating layer 34 is formed on the semiconductor substrate having the metal plug 31a formed thereon (step 7 of FIG. 1). The second insulating layer 34 may include an upper etch stop layer 33 and an upper interlayer insulating layer 35, which are sequentially stacked. The upper etch stop layer 33 is preferably composed of SiN, SiC, or SiCN, and the upper interlayer insulating layer 35 is preferably formed of a low-k dielectric layer.

Figure 6:
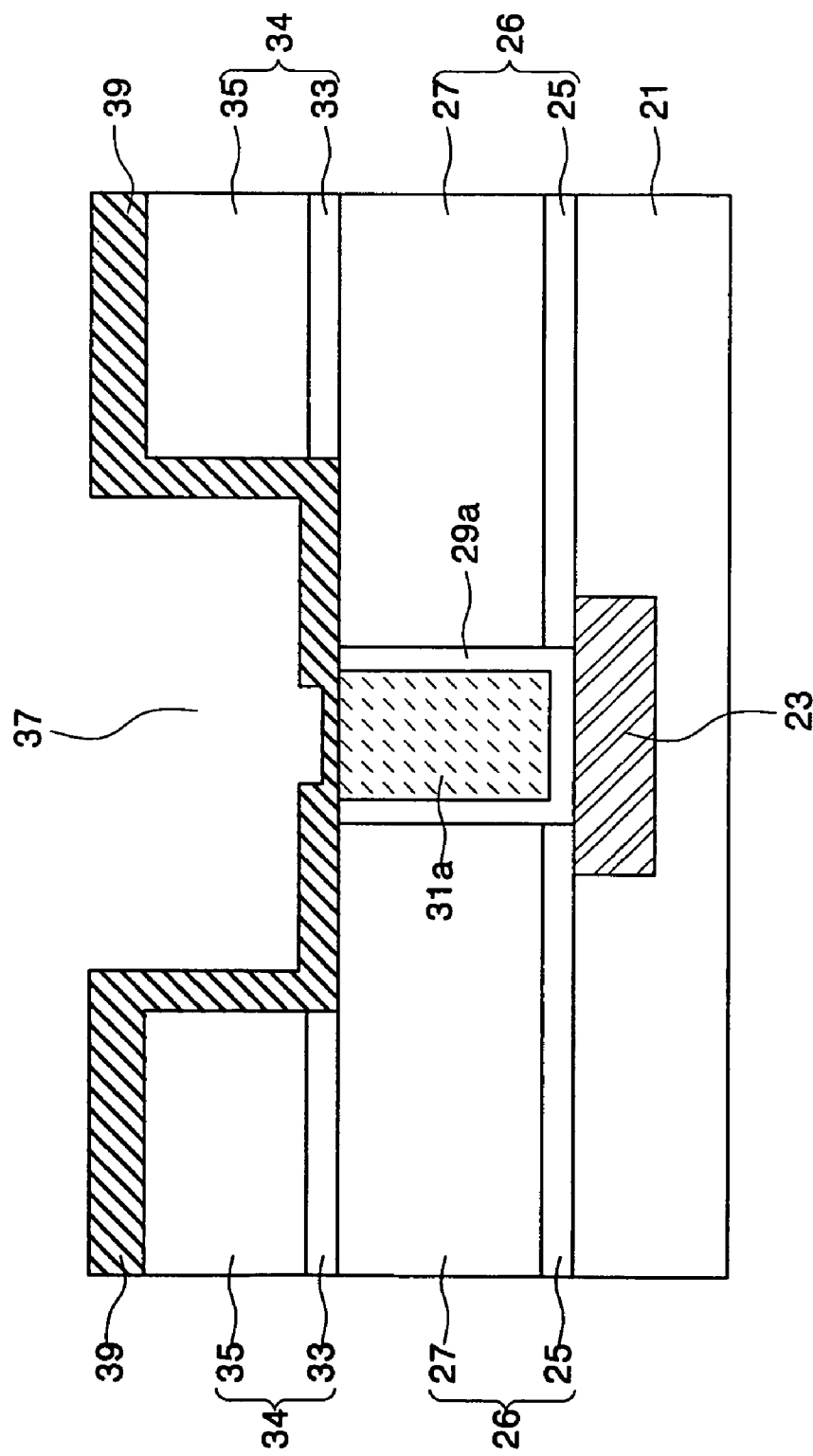

Referring to FIGS. 1 and 6, the second insulating layer 34 is patterned using a photolithography process, thereby forming a groove 37 (opening of FIG. 1), which exposes the metal plug 31a (step 9 of FIG. 1). The groove 37 is formed across an upper portion of the metal plug 31a. Thus, an upper surface of the first insulating layer 26 and the barrier metal layer 29a are exposed through the groove 37.

A diffusion barrier layer 39 is formed on the semiconductor substrate having the groove 37 formed thereon using a selective deposition technique (step 11 of FIG. 1). The diffusion barrier layer 39 is formed to a thickness that is relatively thicker on the surface of the second insulating layer 34 and the surface of the exposed first insulating layer 26 than on the surface of the exposed metal plug 31a. Preferably, the diffusion barrier layer 39 is also formed thicker in thickness on the surface of the exposed barrier metal layer 29a than on the surface of the exposed metal plug 31a. Preferably, the diffusion barrier layer 39 may be formed to a thickness in the range of 30 to 300 Å on the surface of the second insulating layer 34 and the surface of the exposed first insulating layer 26. Further, the diffusion barrier layer 39 preferably includes a metal nitride layer such as Ta, TiN, TaN, and WN, or a metal silicon nitride layer such as TiSiN, TaSiN, and WSiN. The metal silicon nitride layer may be formed by surface-treating the metal nitride layer using $SiH_4$.

Further, the selective deposition technique may comprise a CVD technology or an ALD technology. A method of selectively depositing TiN using a CVD technology is disclosed in the U.S. Pat. No. 6,541,374. The method disclosed in the U.S. Pat. No. 6,541,374 is as follows.

The semiconductor substrate 21 is heated at a temperature of 100 to 400° C., and it is exposed to a gas-phase mixture of ammonia and tetrakis(diethylamido)titanium (TDEAT). The process is performed with a pressure in the range of 10 to 400 torr, and more preferably, it is performed with a pressure in the range of 50 to 70 torr. According to the U.S. Pat. No. 6,541,374, the TiN layer formed on the surfaces of the exposed first insulating layer 26 and the second insulating layer 34 can be formed thicker in thickness than the TiN layer formed on the surface of the exposed metal plug 31a.

Further, in the method disclosed in the U.S. Pat. No. 6,541,374, the TiN layer is formed with discontinuous morphology on the conductive pattern, but in the embodiments of the present invention, it is not necessary to form the TiN layer with discontinuous morphology.

Figure 7:
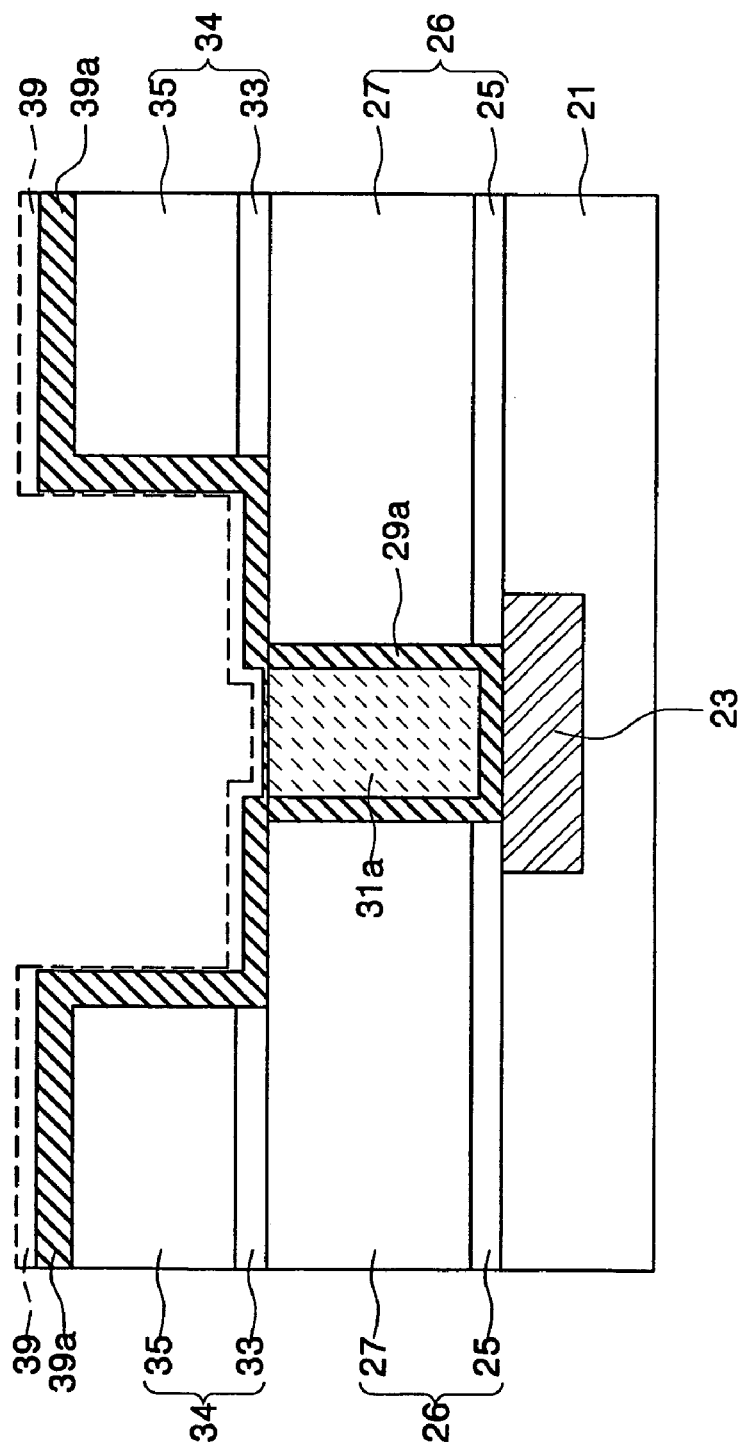

Referring to FIGS. 1 and 7, the diffusion barrier layer 39 is etched, thereby forming a recessed diffusion barrier layer 39a (step 13 of FIG. 1). Preferably, the diffusion barrier layer 39 may be recessed by dry-etching the diffusion barrier layer 39, using an RIE or Ar plasma etch technology. While the diffusion barrier layer 39 is etched, the diffusion barrier layer 39 formed on the metal plug 31a may be completely removed. Further, it is preferable to remove a natural oxide layer (not shown) formed on the metal plug 31a. Thus, while the natural oxide layer is removed, the material dry-etched in the metal plug 31a can be again deposited on the sidewalls of the groove 37. However, the recessed diffusion barrier layer 39a prevents the deposited materials from being diffused into the second insulating layer 34.

Figure 8:
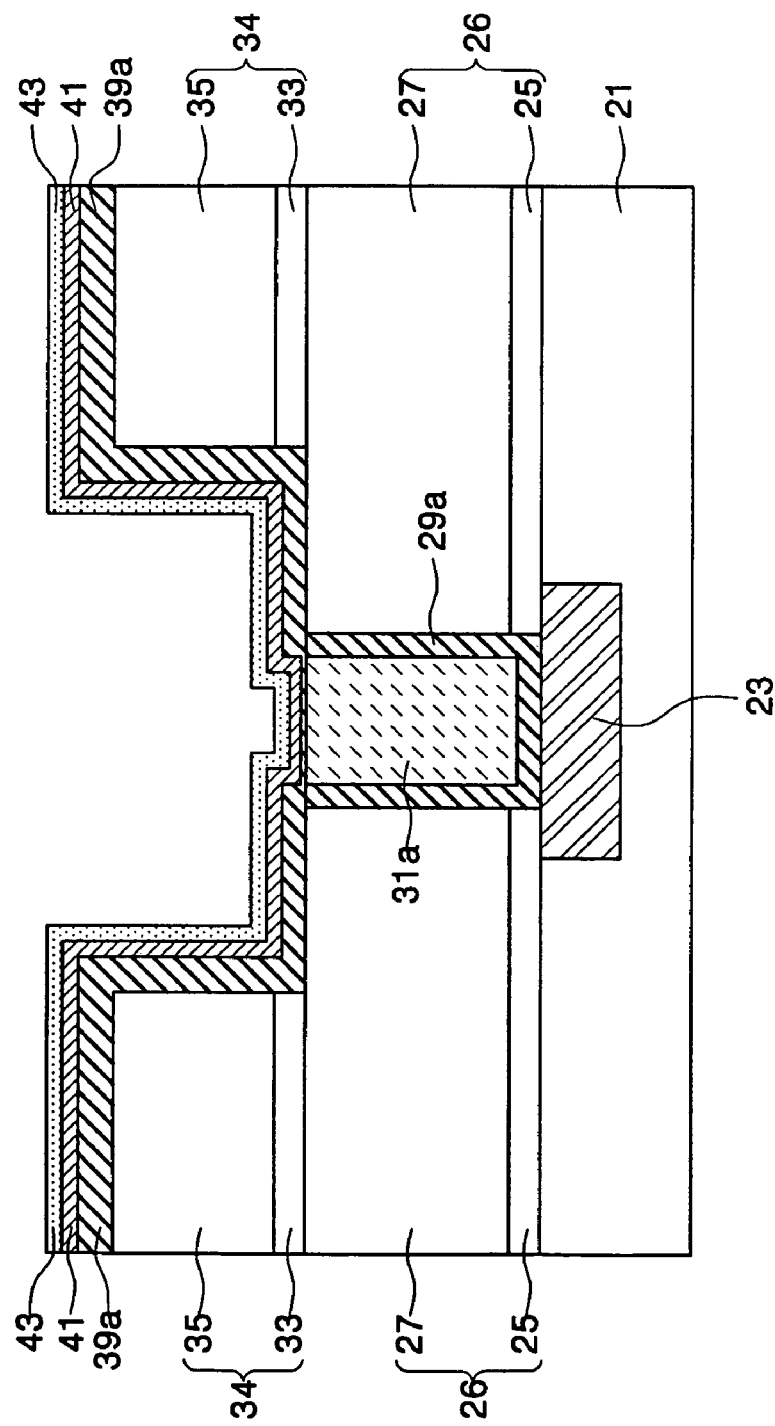

Referring to FIGS. 1 and 8, a seed layer 43 is formed on the recessed diffusion barrier layer 39a (step 15 of FIG. 1). The seed layer 43 may be composed of Cu using a PVD technology. Preferably, before forming the seed layer 43, an adhesion layer 41 may be formed. The adhesion layer 41 may be composed of Ta, Ti, Ru, Co or W, using a PVD technology.

Further, the seed layer 43 may be formed using an i-PVD technology such as SIP+ of Applied Material Co. In the i-PVD technology, the atoms sputtered from a target material are ionized and deposited oh a semiconductor substrate. Further, the i-PVD technology includes etching of the semiconductor substrate using the energy of ionized atoms. Thus, the seed layer 43 is formed using the i-PVD technology and the diffusion barrier layer 39 is concurrently recessed. Thus, the etching process of the diffusion barrier layer 39 using a RIE or Ar plasma etch technology may be omitted.

Further, the adhesion layer 41 is formed using an i-PVD technology. Thus, the adhesion layer 41 is formed and the diffusion barrier layer 39 is concurrently recessed.

Figure 9:
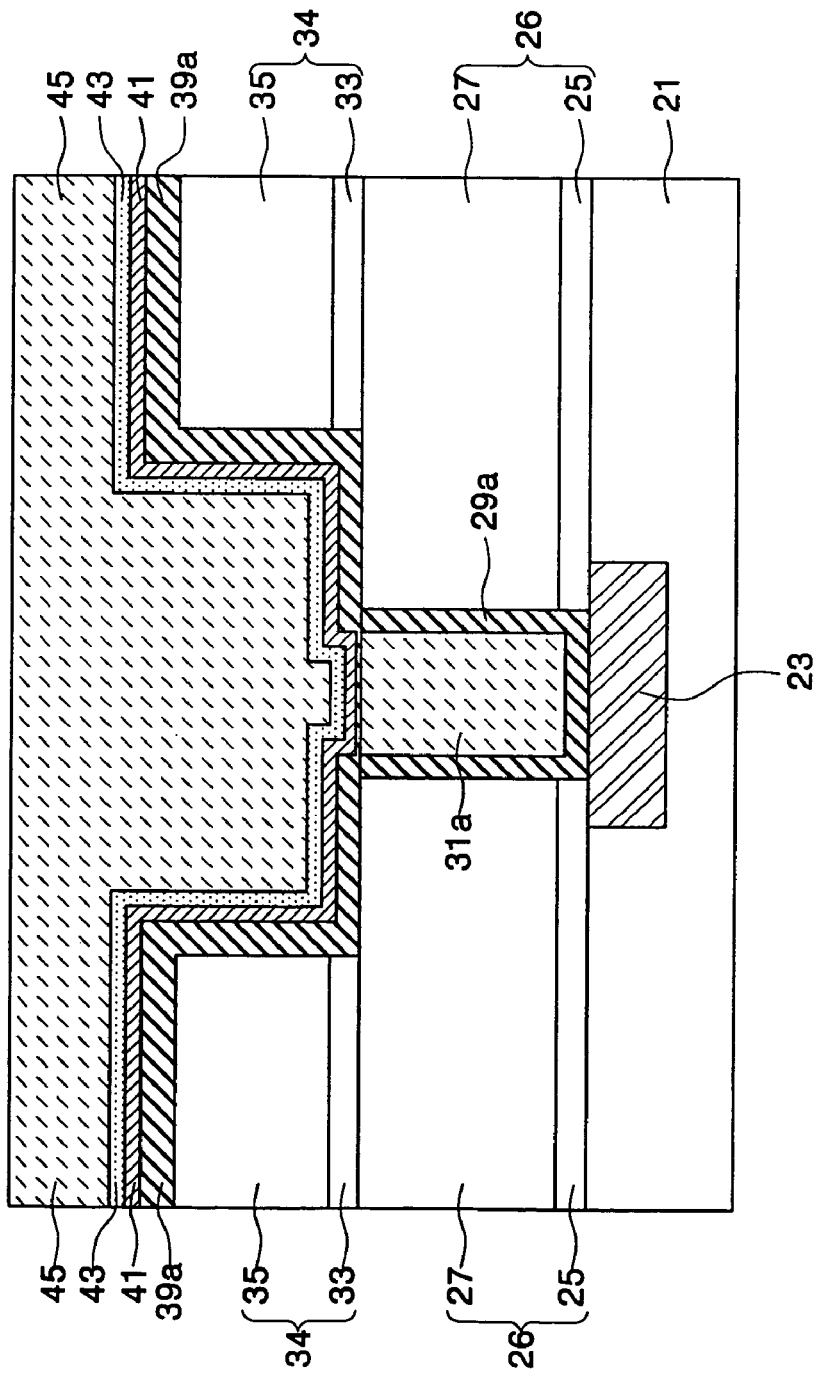

Referring to FIGS. 1 and 9, a Cu plated layer 45 is formed on the semiconductor substrate having the seed layer 43 formed thereon (step 17 of FIG. 1). The Cu plated layer 45 may be formed using a typical electro plating technology and a post anneal technology. The post anneal may be performed in the presence of $N_2$ gas or a mixture of $N_2$ and $H_2$ gases, at a temperature of 200 to 400° C.

Figure 10:
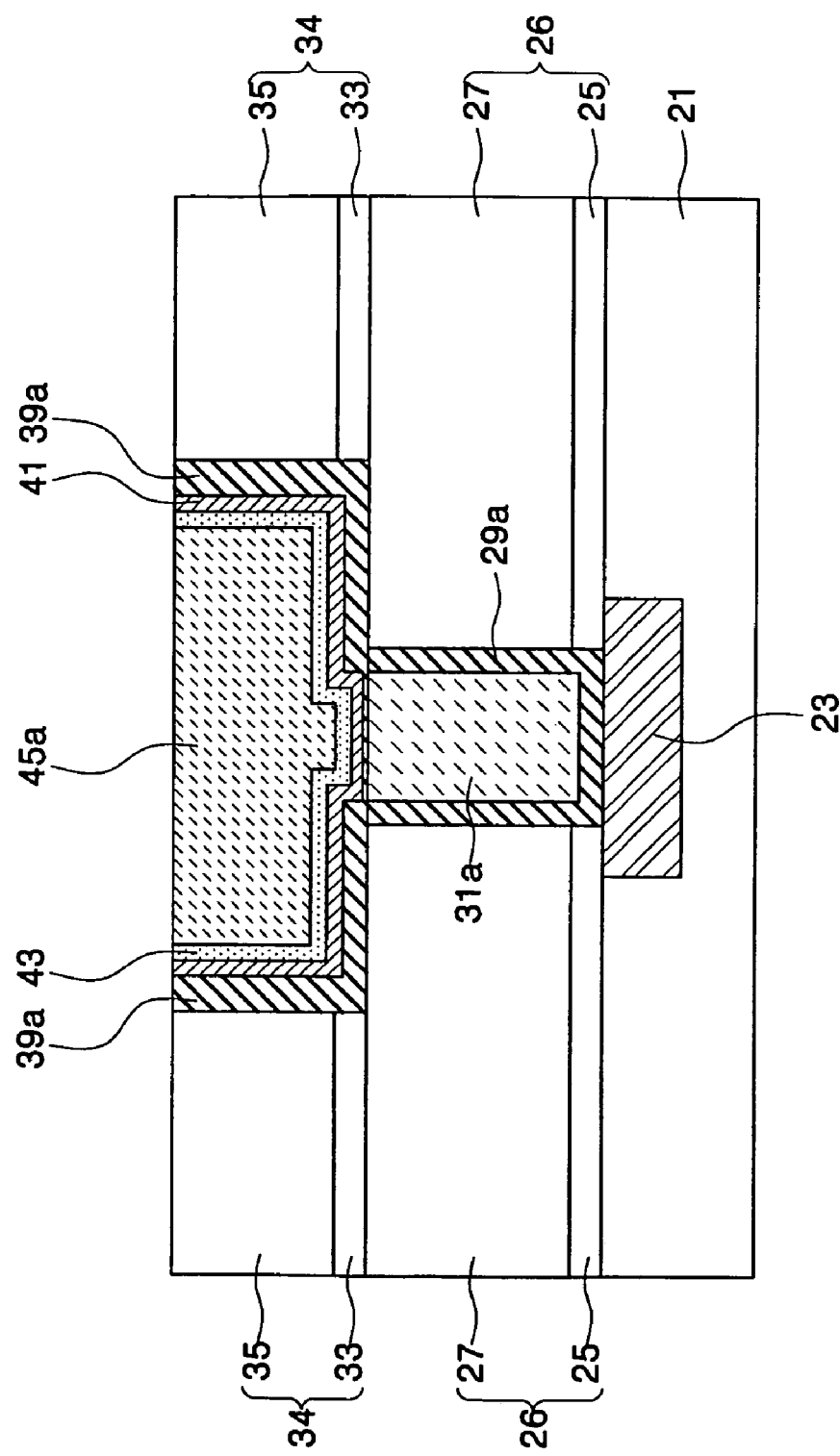

Referring to FIGS. 1 and 10, the Cu plated layer 45, the seed layer 43, the adhesion layer 41, and the recessed diffusion barrier layer 39a are planarized using a CMP technology until an upper surface of the second insulating layer 34 is exposed (step 19 of FIG. 1). As a result, a recessed diffusion barrier layer 39a, an adhesion layer 41, a seed layer 43, and a copper interconnect 45a are formed with confined inside the groove 37.

According to one embodiment of the present invention, the thickness of the diffusion barrier layer 39 interposed between the copper interconnect 45a and the metal plug 31a can be reduced or the diffusion barrier layer 39 can be removed, thereby minimizing via resistance. Further, the recessed diffusion barrier layer 39a remains between the copper interconnect 39 and the second insulating layer 34, and between the copper interconnect 39 and the first insulating layer 26, thereby preventing a diffusion of the copper atoms.

Hereinafter, a semiconductor device according to the first embodiment of the present invention will be explained in detail.

Again referring to FIG. 10, the metal plug 31a is disposed on the semiconductor substrate 21 having the lower conductive pattern 23. The metal plug 31a may be disposed on the lower conductive pattern 23. The metal plug 29a may be an Al plug, a W plug, or a Cu plug.

Further, the metal interconnect 45a is disposed across an upper portion of the metal plug 29a. The metal interconnect 45a may include copper, and may be a copper interconnect.

Further, the first insulating layer 26 covers sidewalls of the metal plug 31a, and extends to be interposed between the metal interconnect 45a and the semiconductor substrate 21.

The first insulating layer 26 may include the lower etch stop layer 25 and the lower interlayer insulating layer 27. Further, the second insulating layer 34 covers sidewalls of the metal interconnect 45a. The second insulating layer 34 may include an upper etch stop layer 33 and an upper interlayer insulating layer 35.

Further, an diffusion barrier layer 39a is interposed between the metal interconnect 45a and the second insulating layer 34, between the metal interconnect 45a and the first insulating layer 26, and between the metal interconnect 45a and the metal plug 31a. The diffusion barrier layer 39a interposed between the metal interconnect 45a and the metal plug 31a may be thinner in thickness than the diffusion barrier layer 39a interposed between the metal interconnect 45a and the first insulating layer 26.

Further, the diffusion barrier layer 39a interposed between the metal interconnect 45a and the first insulating layer 26 may be thinner in thickness than the diffusion barrier layer 39a interposed between the metal interconnect 45a and the second insulating layer 34. Preferably, the diffusion barrier layer 39a interposed between the metal interconnect 45a and the first insulating layer 26 may have a thickness in a range of 10 to 100 Å.

Further, the diffusion barrier layer 39a interposed between the metal interconnect 45a and the metal plug 31a may be continuous or discontinuous.

Meanwhile, the diffusion barrier layer 39a may optionally not be present between the metal interconnect 45a and the metal plug 31a. Thus, an interface resistance between the metal interconnect 45a and the metal plug 31a can be minimized.

Further, a seed layer 43 may be interposed between the metal interconnect 45a and the diffusion barrier layer 39a, and between the metal interconnect 45a and the metal plug 31a. Further, an adhesion layer 41 may be interposed between the seed layer 43 and the diffusion barrier layer 39a, and between the seed layer 43 and the metal plug 31a.

Preferably, the barrier metal layer 29a may be interposed between the metal plug 31a and the first insulating layer 26. Further, the barrier metal layer 29a may extend and may be interposed between the metal plug 31a and the lower conductive pattern 23. In this case, the diffusion barrier layer 39a may be interposed between the metal interconnect 45a and the barrier metal layer 29a.

Hereinafter, a method of fabricating a semiconductor device according to another embodiment of the present invention is provided in reference to accompanying drawings.

FIGS. 11 through 18 are schematic sectional views illustrating a method of fabricating a semiconductor device using a damascene process according to another embodiment of the present invention.

Figure 11:
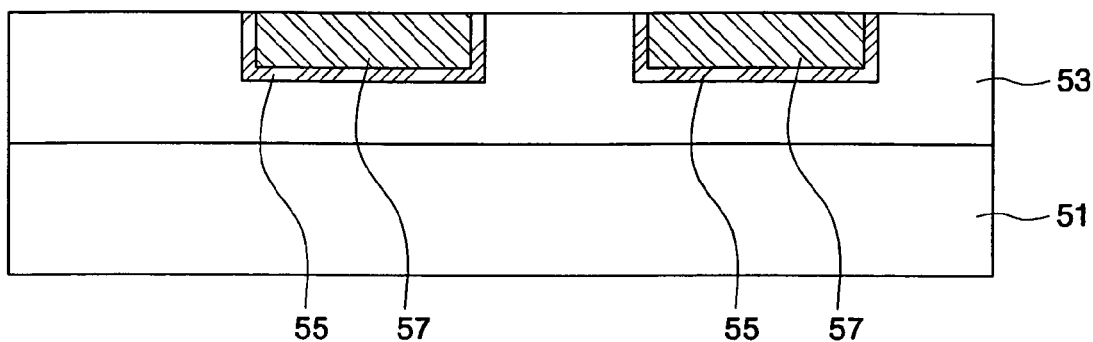
FIGS. 11 to 18 are schematic sectional views illustrating a method of fabricating a semiconductor device using a damascene process according to another embodiment of the present invention.

Referring to FIGS. 1 and 11, a semiconductor substrate 51 is prepared (step 1 of FIG. 1). Individual elements such as a transistor (not shown) or a capacitor (not shown) may be formed inside the semiconductor substrate 51.

A first insulating layer 53 is formed on the semiconductor substrate 51 (step 3 of FIG. 1). The first insulating layer 53 is patterned using a typical photolithography process, thereby forming lower interconnect grooves confined inside the first insulating layer 53. Then, a metal layer for filling the lower interconnect grooves is formed, and patterned, thereby forming lower interconnects 57 (the conductive pattern of FIG. 1) (step 5 of FIG. 1). Preferably, before forming the lower interconnects 57, a barrier metal layer 55 may be formed.

Alternatively, before forming the first insulating layer 53, the metal layer may be formed. The metal layer can be patterned using a typical photolithography process, thereby forming lower interconnects 57. Then, the first insulating layer 53 may be formed on the semiconductor substrate having the lower interconnects 57 formed thereon. The first insulating layer 53 may be planarized using a CMP technology. In this case, the barrier metal layer 55 is not formed on sidewalls of the lower interconnects 57.

Further, the lower interconnects 57 may be composed of Al, Cu or W. However, in the case that the lower interconnects 57 are composed of Cu, the lower interconnects 57 are formed using a damascene process.

Figure 12:
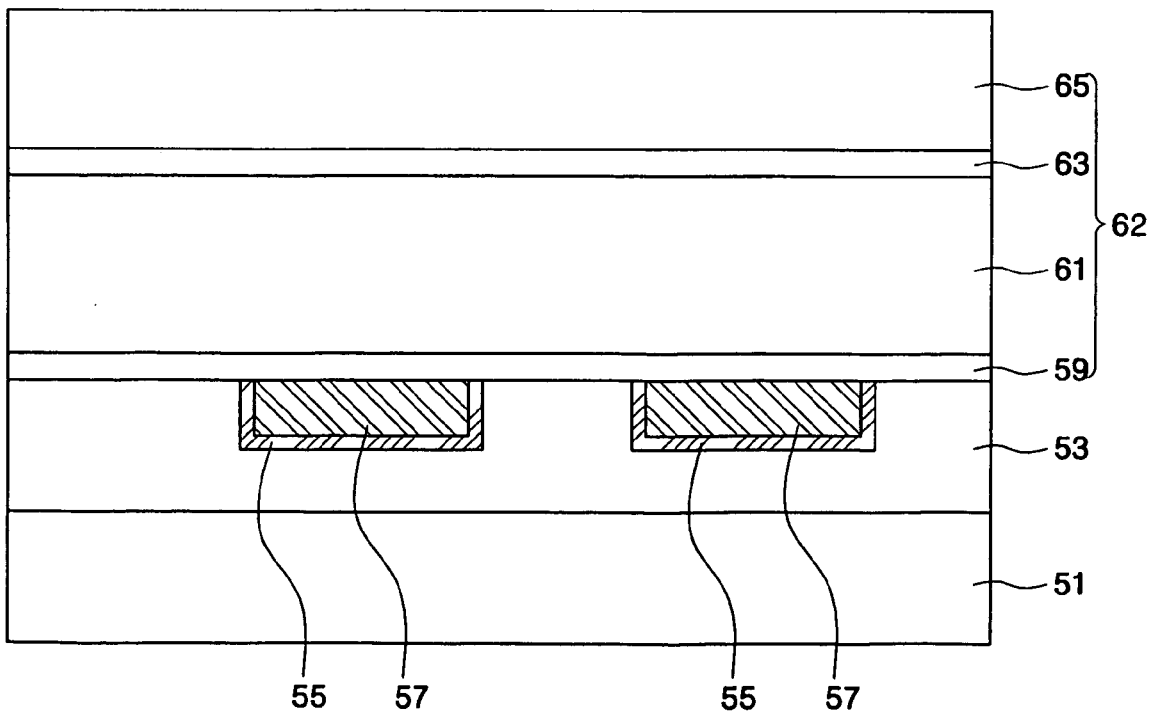

Referring to FIGS. 1 and 12, a second insulating layer 62 is formed on the semiconductor substrate having the first insulating layer 53 and the lower interconnects 57 formed thereon (step 7 of FIG. 1). The second insulating layer 62 may include a lower etch stop layer 59 and a lower interlayer insulating layer 61, and may further include an upper etch stop layer 63 and an upper interlayer insulating layer 65. The etch stop layers 59, 63 may be composed of SiN, SiC, or SiCN. Further, the interlayer insulating layers 61, 65 may be preferably formed of low-k dielectric layers. Further, the upper etch stop layer 63 may be omitted, and the lower interlayer insulating layer 61 and the upper interlayer insulating layer 65 may be formed of same low-k dielectric layers.

Figure 13:
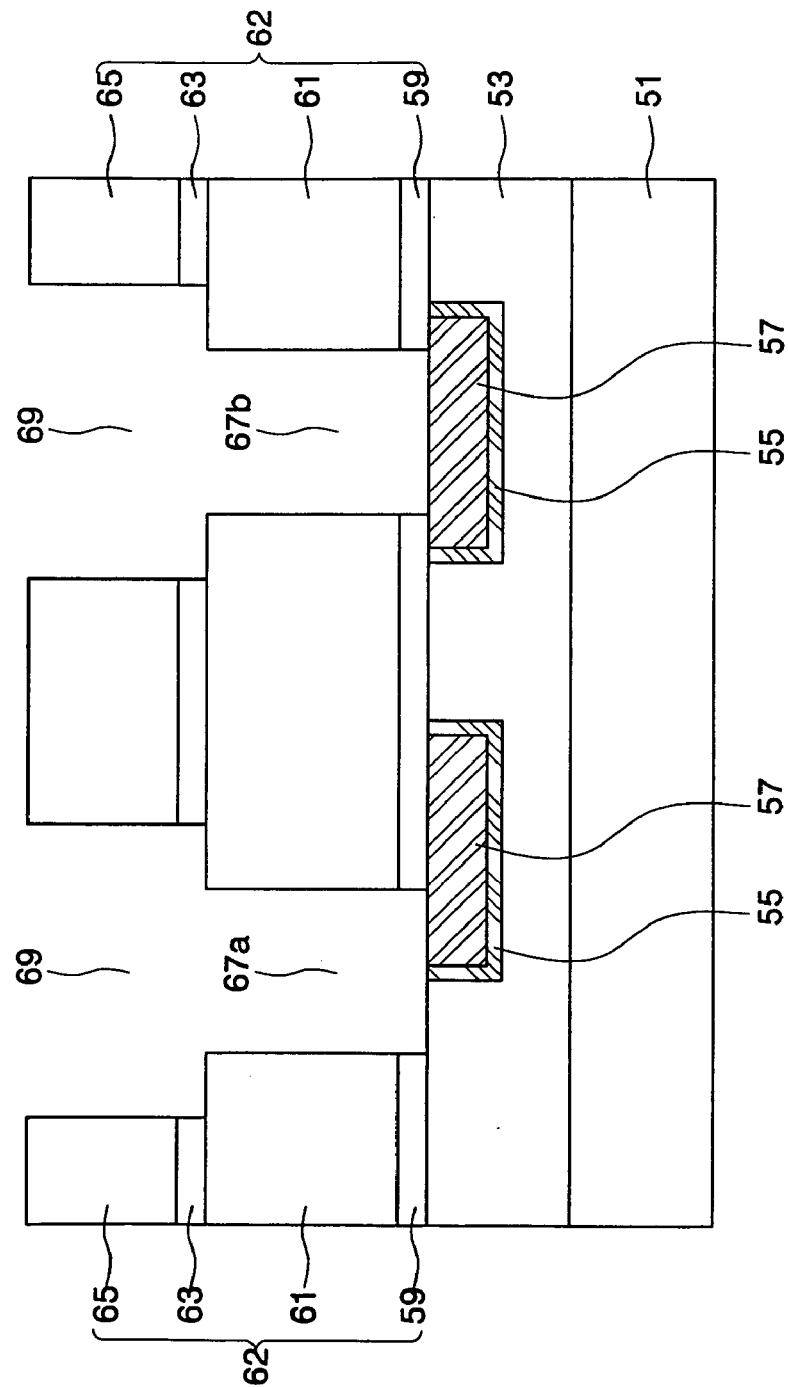

Referring to FIGS. 1 and 13, the second insulating layer 62 is patterned using a photolithography process, thereby forming via holes (openings 67a, 67b of FIG. 1) for exposing the lower interconnects 57 (step 9 of FIG. 1). A via hole 67a for concurrently exposing the lower interconnects 57 and the first insulating layer 53 is defined as an "unlanded" via hole 67a, and a via hole 67b that exposes exclusively the lower interconnects 57 is defined as a landed via hole 67b.

The unlanded via hole 67a may be formed as a result of misalignment of the lower interconnects 57 and the via hole 67a. The unlanded via hole 67a is often times formed in the case where the via holes 67a, 67b cannot be reduced in size to comply with a reduction of a line width of the lower interconnect 57 with the high integration of semiconductor devices. Particularly, the unlanded via hole 67a is formed when a via hole is formed with a relatively great width in comparison with a line width of the lower interconnect 57 due to limitations in the photolithography process.

Further, while the second insulating layer 62 is patterned to form the via holes 67a, 67b, upper interconnect grooves 69 may be formed across an upper portion of the via holes 67a, 67b.

Figure 14:
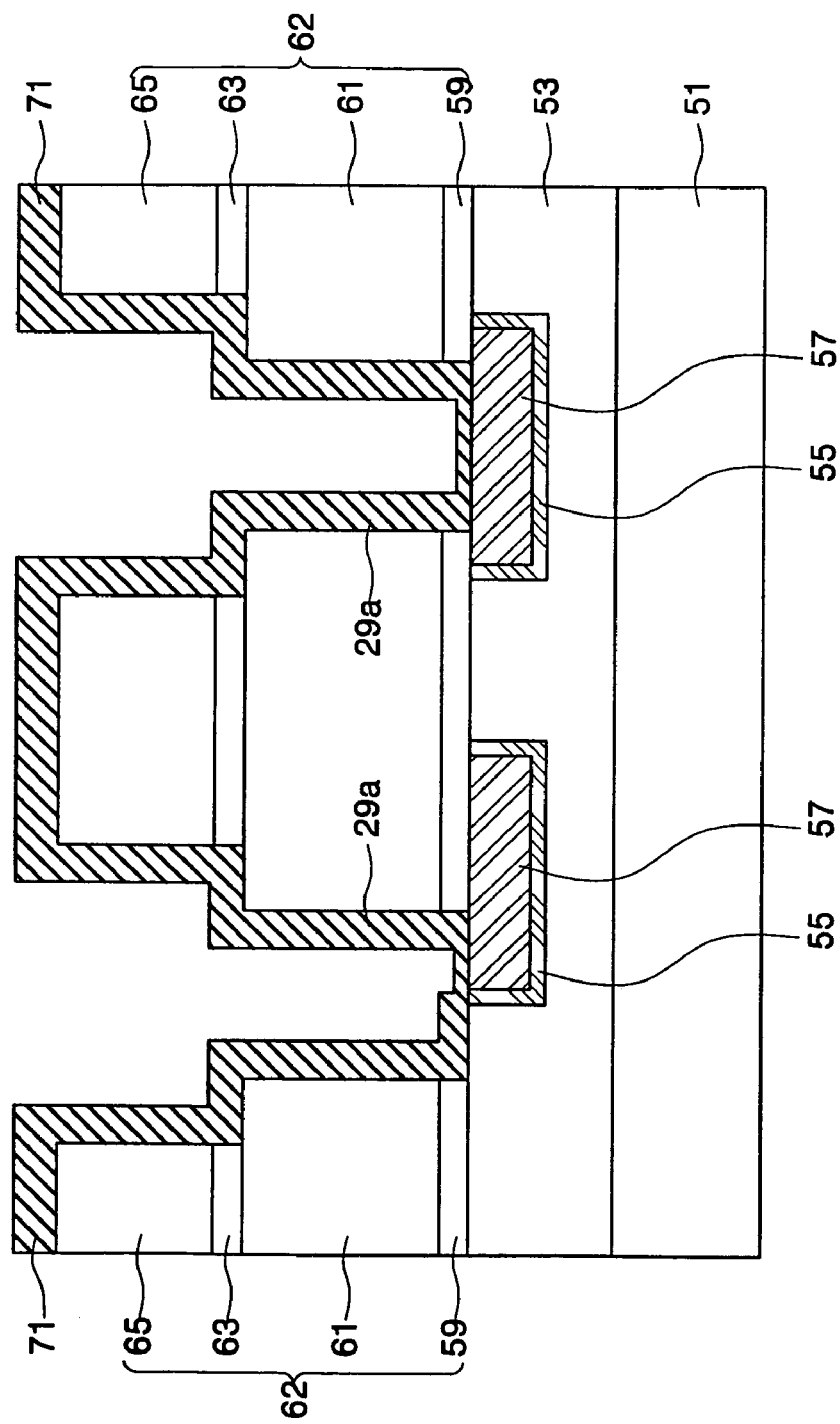

Referring to FIGS. 1 and 14, a diffusion barrier layer 71 is formed on the semiconductor substrate having the via holes 67a, 67b and the upper interconnect grooves 69 formed thereon, using a selective deposition technique (step 11 of FIG. 1). The diffusion barrier layer 71, which is formed on the surface of the second insulating layer 62 and on the surface of the exposed first insulating layer 53, is thicker in thickness than the diffusion barrier layer 71, which is formed on the surface of the exposed lower interconnects 57. Preferably, the diffusion barrier layer 71 is formed at a thickness that is relatively thicker on the surface of the exposed barrier metal layer 56 than on the surface of the exposed lower interconnects 57. Preferably, the diffusion barrier layer 71 is formed to have a thickness in a range of 30 to 300 Å on the surface of the second insulating layer 62 and the surface of the exposed first insulating layer 53. Further, the diffusion barrier layer 71 is preferably formed of a metal nitride layer such as Ta, TiN, TaN, and WN, or a metal silicon nitride layer such as TiSiN, TaSiN, and WSiN. The metal silicon nitride layer may be formed by surface-treating the metal nitride layer comprising $SiN_4$.

The selective deposition technique may be a CVD technology or an ALD technology as described in reference to FIG. 6.

Figure 15:
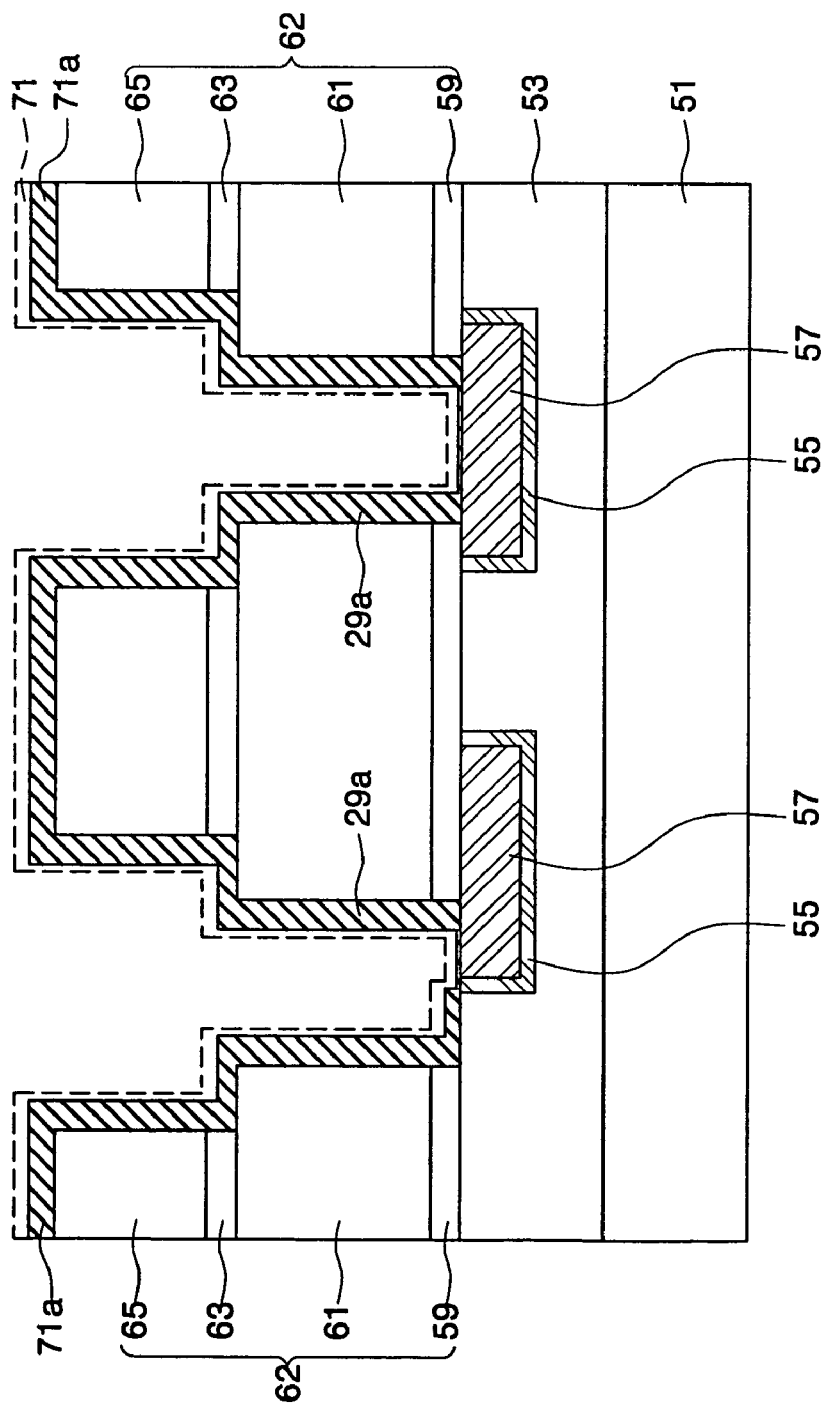

Referring to FIGS. 1 and 15, the diffusion barrier layer 71 is etched, thereby forming a recessed diffusion barrier layer 71a (step 13 of FIG. 1). As described above in reference to FIG. 7, the diffusion barrier layer 71 is dry-etched using a RIE or Ar plasma etching technology, thereby recessing the diffusion barrier layer 71. While the diffusion barrier layer 71 is etched, the diffusion barrier layer 71 formed on the lower interconnects 57 may be completely removed. Further, it is preferable to remove a natural oxide layer (not shown) that is formed on the lower interconnects 57. Thus, while removing the natural oxide layer, a material dry-etched on the lower interconnects 57 may be again deposited on sidewalls of the via holes 67a, 67b. However, the recessed diffusion barrier layer 71a prevents the deposited material from being diffused into the second insulating layer 62.

Figure 16:
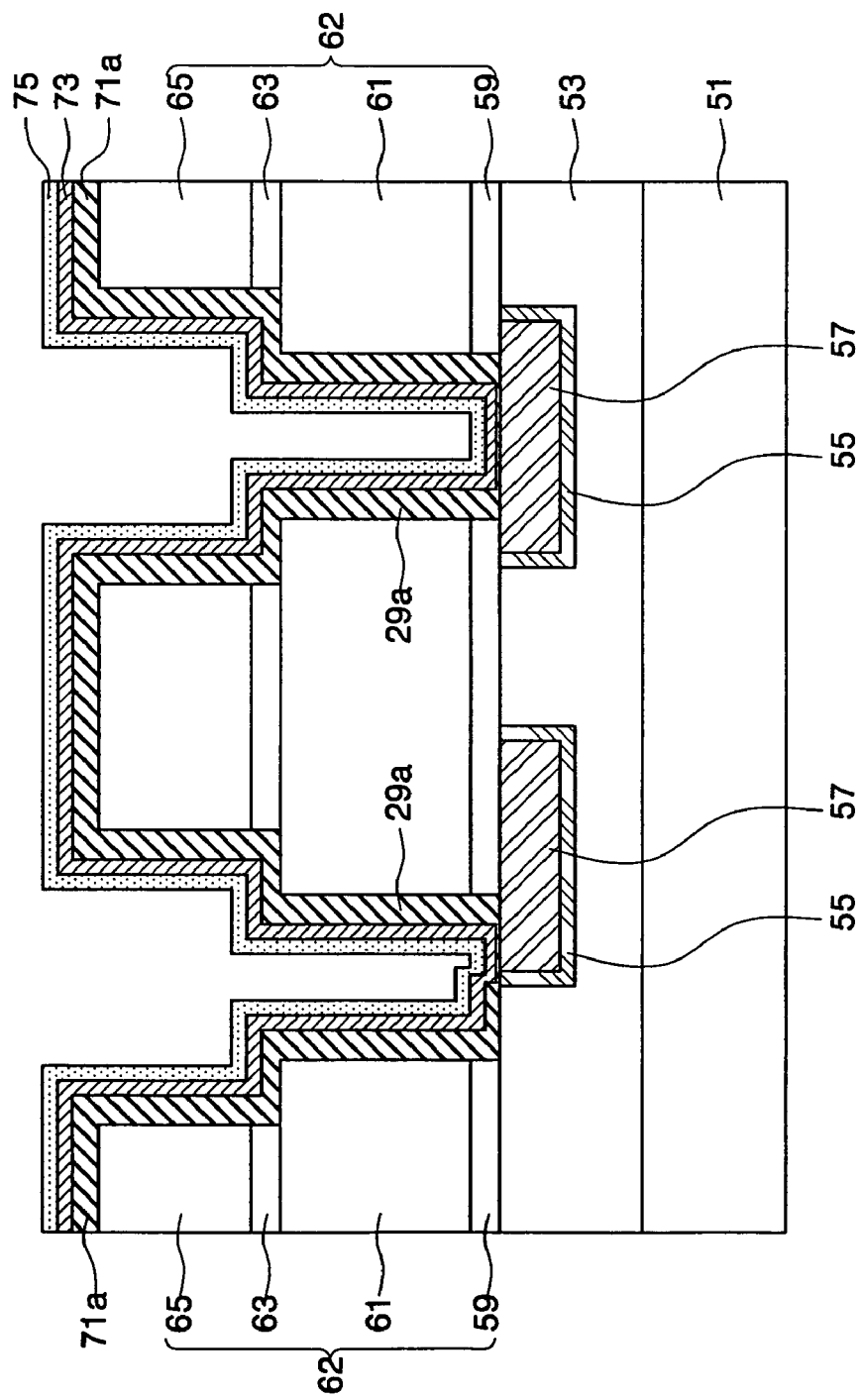

Referring to FIGS. 1 and 16, a seed layer 75 is formed on the recessed diffusion barrier layer 71a (step 15 of FIG. 1). The seed layer 75 may be composed of copper using a PVD technology as described in reference to FIG. 8. Preferably, before forming the seed layer 75, an adhesion layer 73 may be formed. The adhesion layer 73 may be composed of Ta, Ti, Ru, Co or W using a PVD technology.

Further, the seed layer 75 may be formed using an i-PVD technology as described above in reference to FIG. 8. While the seed layer 75 is formed using the i-PVD technology, it is possible to concurrently recess the diffusion barrier layer 71. Thus, the etching process of the diffusion barrier layer 71 using an RIE or Ar plasma etching technology may be omitted.

Further, the adhesion layer 73 may be formed using an i-PVD technology as described in reference to FIG. 8. Thus, while the adhesion layer 73 is formed, it is possible to concurrently etch the diffusion barrier layer 71, thereby forming a recessed diffusion barrier layer 71a.

Figure 17:
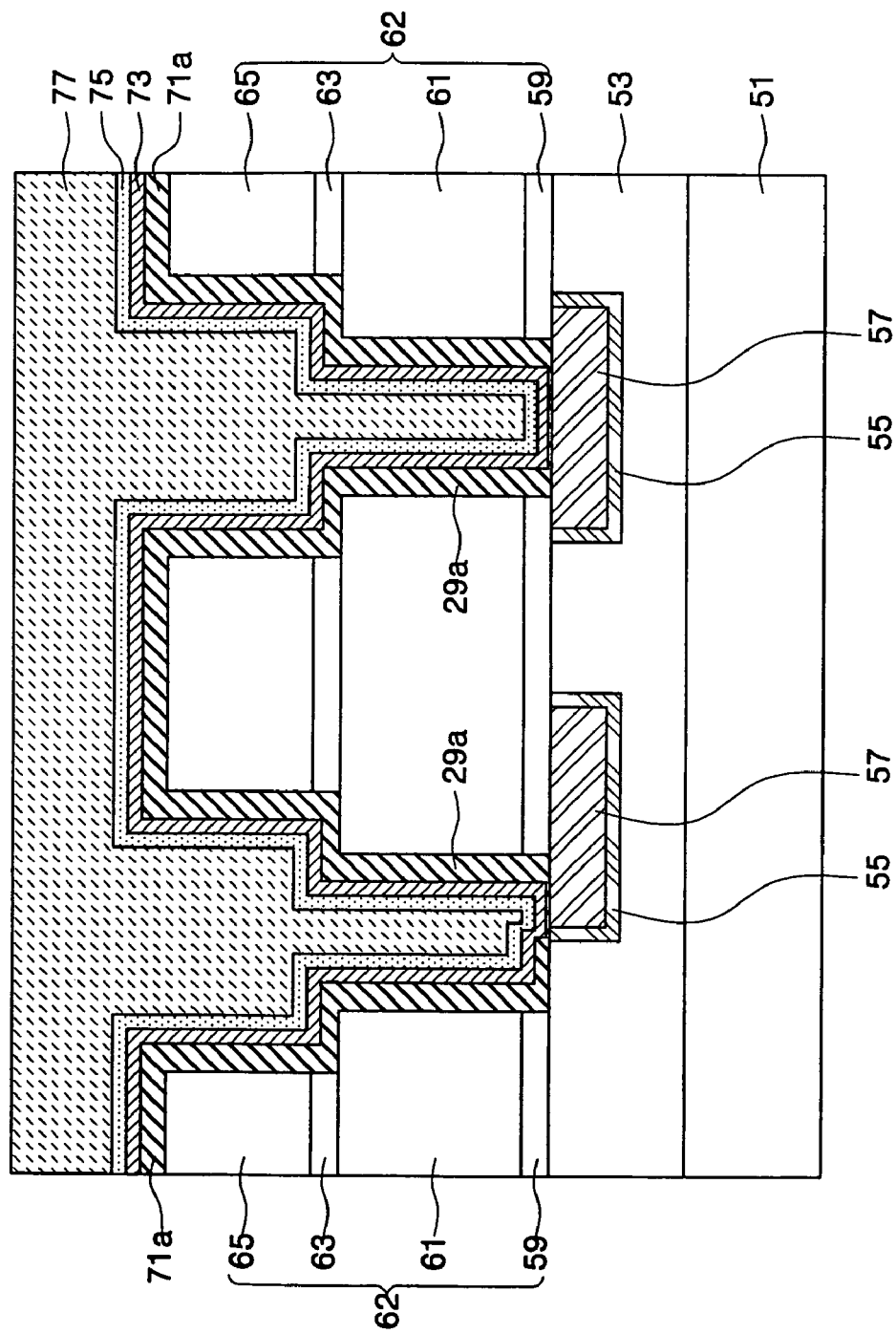

Further, referring to FIGS. 1 and 17, a Cu plated layer 77 is formed on the semiconductor substrate having the seed layer 75 formed thereon using the same method as that described above in reference to FIG. 9 (step 17 of FIG. 1). The Cu plated layer 77 fills empty spaces of the via holes 67a, 67b and the upper interconnect grooves 69.

Figure 18:
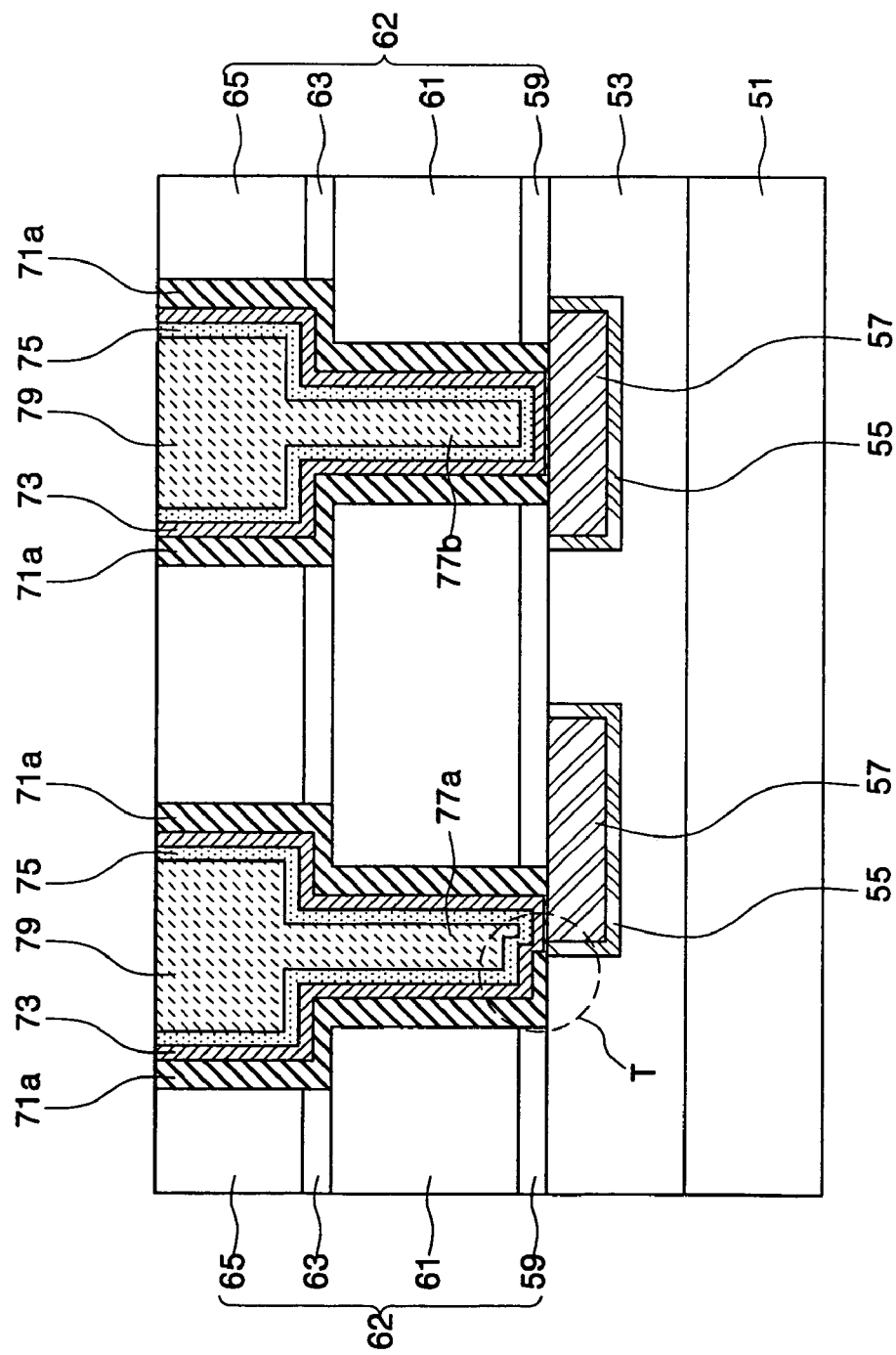

Referring to FIGS. 1 and 18, the Cu plated layer 77, the seed layer 75, the adhesion layer 73, and the recessed diffusion barrier layer 71a are planarized using a CMP technology until an upper surface of the second insulating layer 62 is exposed (step 19 of FIG. 1). As a result, there are formed metal plugs 77a, 77b, which fill the via holes 67a, 67b, and metal interconnects 79, which fill the upper interconnect grooves 69. Here, the metal plug 77a filling the unlanded via hole 67a is defined as an "unlanded via", and the metal plug 77b filling the landed via hole 67b is defined as a "landed via".

According to the second embodiment of the present invention, a thickness of the diffusion barrier layer 71 between the metal plugs 77a, 77b and the lower interconnects 57 can be reduced or minimized, thereby minimizing via resistance. Further, the recessed diffusion barrier layer 71a remains between the metal plug 77a and the first insulating layer 53 in the unlanded via, thereby preventing diffusion of copper atoms.

Now, hereinafter, a semiconductor device formed in accordance with the second embodiment of the present invention will be explained in detail.

Again, referring to FIG. 18, the lower interconnect 57 is disposed on the semiconductor substrate 51. The lower interconnects 57 may be Al, Cu, or W interconnects.

The first insulating layer 53 covers sidewalls of the lower interconnect 57. Further, the first insulating layer 53 may be interposed between the lower interconnect 57 and the semiconductor substrate 51.

The metal plug 77a is disposed at an interface between the lower interconnect 57 and the first insulating layer 53. That is, the metal plug 77a is an unlanded via. Further, the metal plug 77a may include copper, and may be a Cu plug.

Further, the second insulating layer 62 covers sidewalls of the metal plug 77a. The second insulating layer 62 may include a lower etch stop layer 59 and a lower interlayer insulating layer 61, which are sequentially stacked. The second insulating layer 62 may further include an upper etch stop layer 63 and an upper interlayer insulating layer 65. In other embodiments, the upper etch stop layer 63 is not formed, and the lower interlayer insulating layer 61 and the upper interlayer insulating layer 63 may be composed of a same material.

A diffusion barrier layer 71a is interposed between the metal plug 77a and the second insulating layer 62, between the metal plug 77a and the first insulating layer 53, and between the metal plug 77a and the lower interconnect 57. The diffusion barrier layer 71a interposed between the metal plug 77a and the lower interconnect 57 is thinner in thickness than the diffusion barrier layer 71a interposed between the metal plug 77a and the first insulating layer 53.

Further, the diffusion barrier layer 71a interposed between the metal plug 77a and the first insulating layer 53 my optionally be thinner in thickness than the diffusion barrier layer 71a interposed between the metal plug 77a and the second insulating layer 62. Preferably, the diffusion barrier layer 71a interposed between the metal plug 77a and the first insulating layer 53 may have a thickness in a range of 10 to 100 Å.

Further, the diffusion barrier layer 71a interposed between the metal plug 77a and the lower interconnect 57 may be continuous or discontinuous.

Alternatively, in another embodiment, the diffusion barrier layer 71a is not present between the metal plug 77a and the lower interconnect 57. In this manner, the interface resistance between the metal plug 77a and the lower interconnect 57 can be minimized.

Further, a seed layer 75 may be interposed between the metal plug 77a and the diffusion barrier layer 71a and between the metal plug 77a and the lower interconnect 57. Further, an adhesion layer 73 may be interposed between the seed layer 75 and the diffusion barrier layer 71a, and between the seed layer 75 and the lower interconnect 57.

Further, a barrier metal layer 55 may be interposed between the lower interconnects 57 and the first insulating layer 53. The diffusion barrier layer 71a is interposed between the barrier metal layer 55 and the metal plug 77a.

Further, a metal interconnect 79 confined inside the second insulating layer 62 may be disposed across an upper portion of the metal plug 77a. The metal interconnect 79 may be confined inside the upper etch stop layer 63 and the upper interlayer insulating layer 65. In this case, the diffusion barrier layer 71a extends and is interposed between the metal interconnect 79 and the second insulating layer 62. Further, the seed layer 75 and the adhesion layer 73 may extend and be interposed between the metal interconnects 79 and the diffusion barrier layer 71a.

According to this embodiment of the present invention, the diffusion barrier layer 71a is interposed between the metal plug 77a and the first insulating layer 53, and between the metal plug 77a and the second insulating layer 62, in the unlanded via, thereby preventing a diffusion of the copper atoms. Further, the thickness of the diffusion barrier layer 71a interposed between the metal plug 77a and the lower interconnect 57 is minimized, thereby minimizing the resulting via resistance.

EXAMPLE

Hereinafter, various measurement results of sample devices fabricated according to the embodiments of the present invention will be explained. Here, the samples are fabricated in accordance with the process sequences explained above with reference to FIGS. 11 to 18. The lower interconnect 57 (FIG. 11) is a Cu interconnect, and the barrier metal layer 55 (FIG. 11) is formed. Further, the second insulating layer 62 (FIG. 12) is formed by stacking the lower etch stop layer 59, the lower interlayer insulating layer 61, the upper etch stop layer 63, and the upper interlayer insulating layer 65 as shown in FIG. 12. The interlayer insulating layers 61, 65 are formed with a thickness of 4000 Å, and the via hole 67a (FIG. 13) is formed with a width of 0.18 μm. Further, the diffusion barrier layer 71 (FIG. 14) is composed of TiN by a CVD technology using TDEAT as a precursor.

Figure 19:
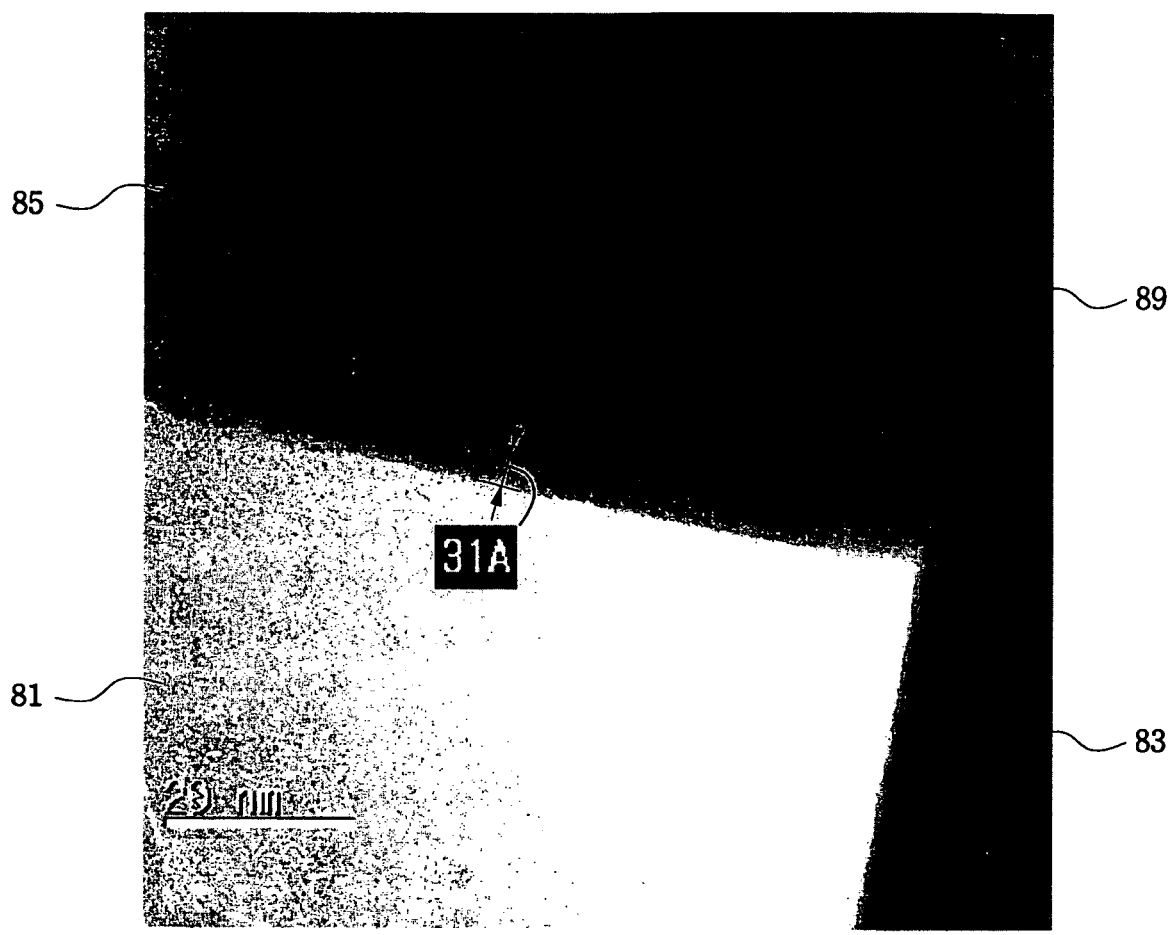
FIG. 19 is a TEM photograph captured to illustrate a recessed diffusion barrier layer in an unlanded via fabricated according to another embodiment of the present invention.

FIG. 19 is a TEM photograph capturing a T region of FIG. 18 to illustrate the recessed diffusion barrier layer, which is interposed between the first insulating layer and the metal plug in an unlanded via. Here, the diffusion barrier layer is formed on an upper surface of the upper interlayer insulating layer 65 (FIG. 14) with a thickness of 200 Å. The diffusion barrier layer is etched using an Ar plasma etching technology, thereby forming a recessed diffusion barrier layer 85. The Ar plasma etching is performed using a 50 Å thermal oxide layer target. Further, a seed layer and a Cu plated layer are formed on the semiconductor substrate having the recessed diffusion barrier layer 85, and an adhesion layer is not formed. Then, the Cu plated layer is planarized, thereby forming a metal plug 89.

Referring to FIG. 19, a recessed diffusion barrier layer 85 having a thickness of about 31 Å has been observed between the first insulating layer 81 and the metal plug 89, but the recessed diffusion barrier layer 85 has been not observed between the metal plug 89 and the lower interconnect 83. Further, a minimum thickness of the recessed diffusion barrier layer 85 on sidewalls of the metal plug 89 has been observed as about 60 Å.

Figure 20:
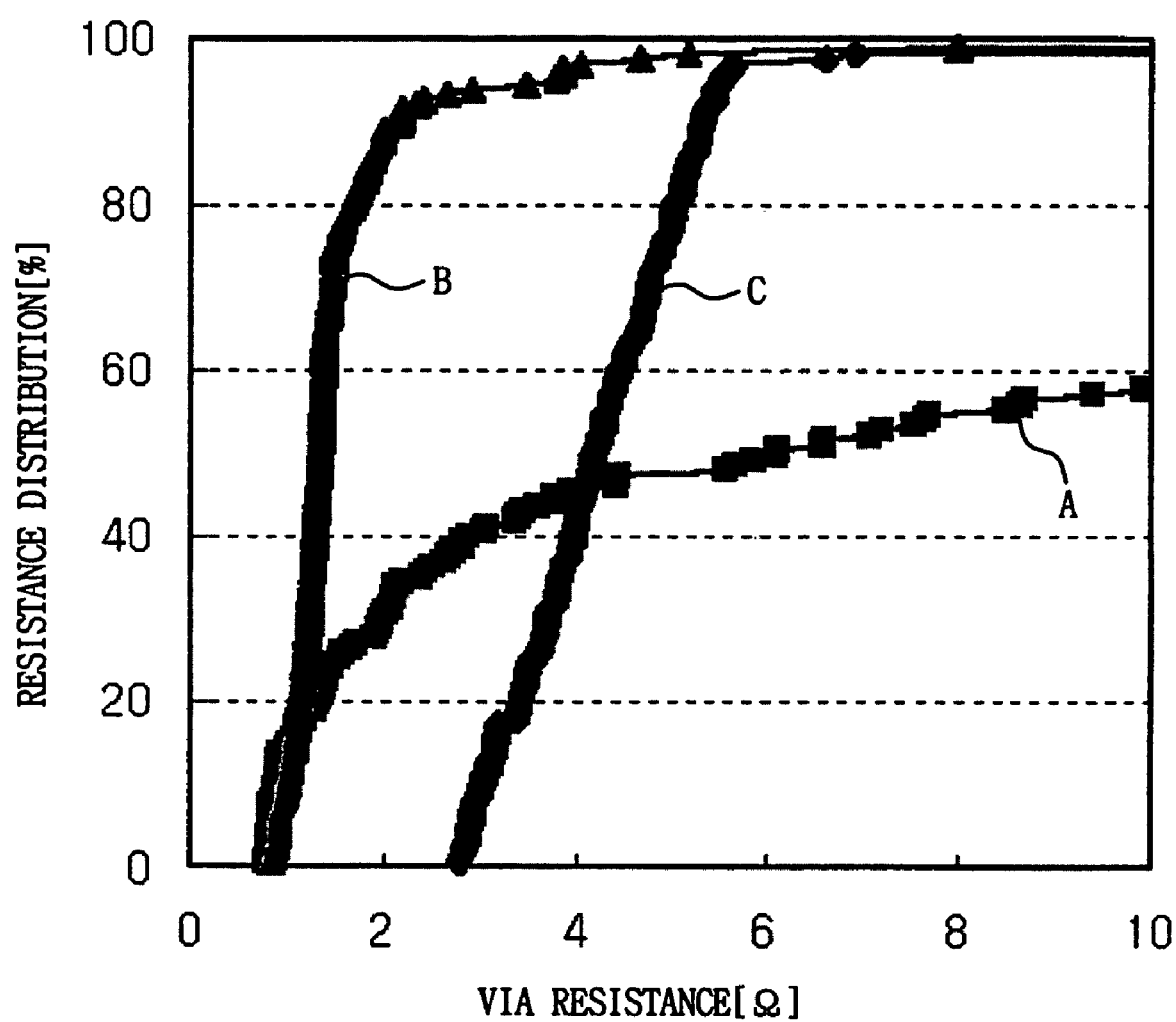
FIGS. 20 and 21 are graphs illustrating via resistances in accordance with a thickness of a diffusion barrier layer and via resistances in accordance with whether the diffusion barrier layer is recessed.
Figure 21:
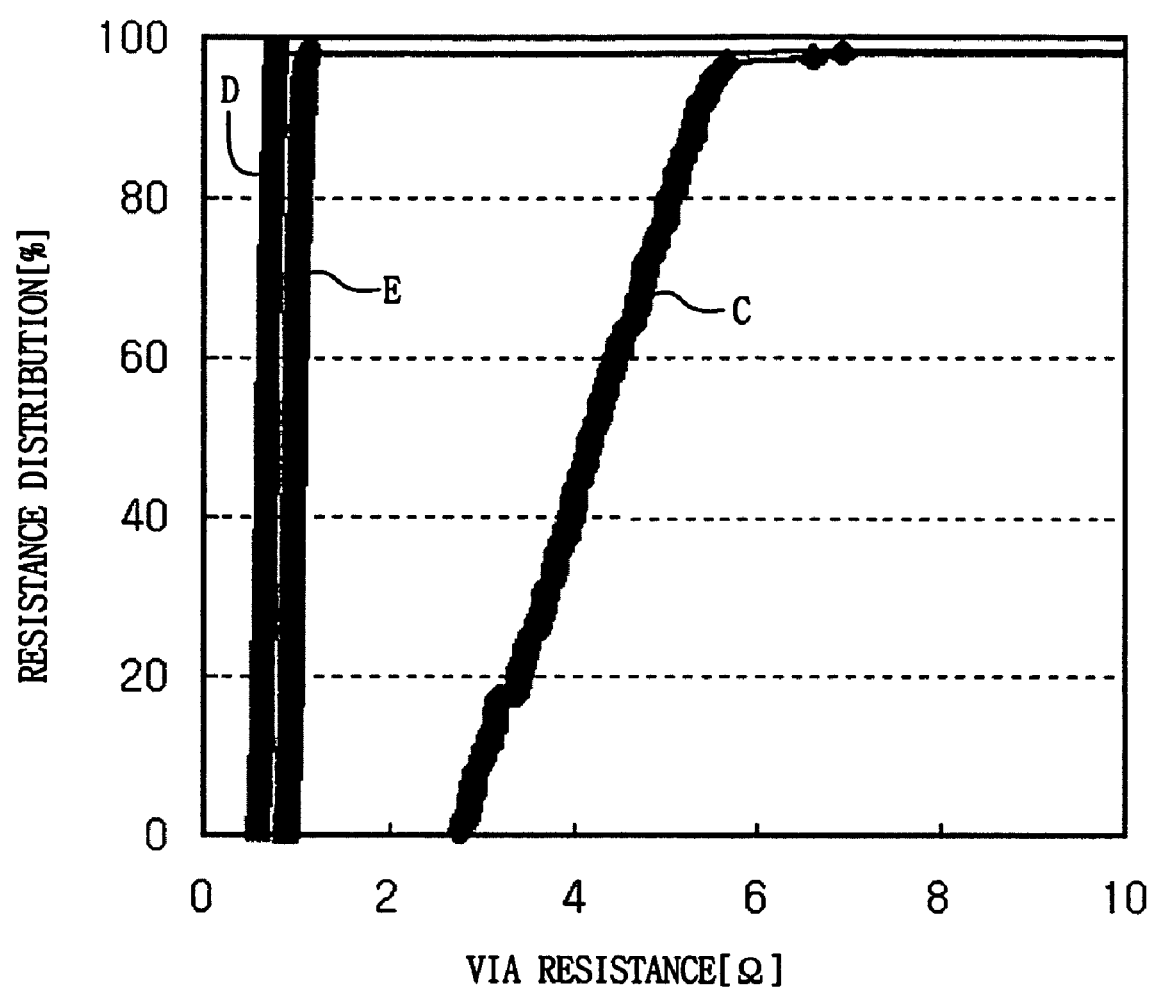

FIGS. 20 and 21 are graphs illustrating measured via resistances in accordance with a thickness of the diffusion barrier layer 71 (FIG. 14) and measured via resistances in accordance with whether the diffusion barrier layer 71 is recessed.

Here, fabrication conditions of the samples of FIGS. 20 and 21 are shown in Table 1.

TABLE 1

| conditions | samples | | | | |
|---|---|---|---|---|---|
| | A | B | C | D | E |
| thickness (Å) of diffusion barrier layer (TiN) | 50 | 100 | 200 | 200 | 200 |
| Ar plasma etching (thermal oxide layer target) | — | — | — | 50 Å | 50 Å |
| adhesive layer | — | — | — | — | Ta 100 Å |
| seed layer/Cu plated layer | | | 1200 Å/8000 Å | | |

In the samples of FIGS. 20 and 21, the diffusion barrier layer 71 is composed of TiN. The samples of FIG. 20 are fabricated by varying a thickness of the diffusion barrier layer 71. That is, a thickness of the TiN layer on the upper interlayer insulating layer 65 in each of the samples A, B, and C is respectively 50 Å, 100 Å, and 200 Å. Further, surfaces of the TiN layers are treated using $SiH_4$. Further, in the fabrication of the samples of FIG. 20, a process of etching the diffusion barrier layer 71 is omitted, and the seed layer 75 and the Cu plated layer 77 are formed on the diffusion barrier layer 71.

Meanwhile, the samples of FIG. 21 are fabricated to have TiN layers having the same thickness. That is, a thickness of the TiN layer on the upper interlayer insulating layer 65 in each of the samples C, D, and E is 200 Å. Further, in each of the samples D and E, the TiN layer is etched using an Ar plasma etching technology with 50 Å of a thermal oxide layer target, thereby forming a recessed diffusion barrier layer 71a. Then, the adhesion layer 73 is composed of Ta in the sample E. The Ta layer on the upper interlayer insulating layer 65 has a thickness of 100 Å. Each sample includes the same seed layer 75 and a same Cu plated layer 77, and using a CMP technology, a planarization process is performed.

The samples are annealed in a vacuum atmosphere at a temperature of 400° C. for 2 hours, and a via resistance is measured using a chain pattern. The chain pattern is composed of 430,000 via chains.

Referring to FIG. 20, the resulting resistance distribution was nonuniform in the samples A and B, in which a thickness of the TiN layer was relatively thin, as compared with the sample C, in which a thickness of the TiN layer was relatively thick. This is because stress migration was generated due to the high-temperature annealing treatment and a void was formed inside the via when the thickness of the TiN layer was thin. Further, as the thickness of the TiN layer was increased, the more the resistance distribution was improved, however the via resistance showed higher levels. This is because the TiN layer having a high resistivity was interposed between the lower interconnect 57 and the copper plugs 77a, 77b, and increased the via resistance.

Referring to FIG. 21, the via resistance was lower and showed a more uniform distribution in the samples D and E in which the TiN layer was recessed, than in the sample C which did not have a recessed TiN layer. Via resistance was slightly more increased in the sample E, in which the adhesion layer 73 was composed of Ta, than in the sample D, which did not include the adhesion layer 73. However, the via resistance distribution showed little difference.

As a result, a uniform resistance distribution can be achieved by forming the TiN layer and etching it, and via resistance can be reduced.

According to the present invention, there is provided a method of fabricating a semiconductor device being capable of preventing a diffusion of metal atoms, and minimizing a via resistance, by forming a diffusion barrier layer using a selective deposition technique and etching the diffusion barrier layer in order to form a recessed diffusion barrier layer. Therefore, a diffusion of copper atoms can be prevented in an unlanded via due to misalignment, and the burden of a photolithography process for aligning a via hole in a lower interconnect can therefore be reduced.

According to the present invention, there is provided a semiconductor device being capable of preventing a diffusion of metal atoms, and minimizing a via resistance.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method of fabricating a semiconductor device comprising:
   forming a conductive pattern and an insulating layer, which covers the conductive pattern, on a semiconductor substrate;
   patterning the insulating layer, thereby forming an opening for exposing at least a portion of the conductive pattern;
   forming a diffusion barrier layer in the opening, using a selective deposition technique, in which, during the selective deposition, the diffusion barrier layer is formed to a thickness that is less on the exposed conductive pattern than on the insulating layer exposed inside the opening; and
   etching the selectively deposited diffusion barrier layer, thereby forming a recessed diffusion barrier layer.

2. The method according to claim 1, wherein the recessed diffusion barrier layer is greater in thickness on a surface of the insulating layer exposed inside the opening than on the exposed conductive pattern.

3. The method according to claim 2, wherein the etching operation of the diffusion barrier layer is performed using an RIB (reactive ion etch) technology, or an Ar plasma etching technology.

4. The method according to claim 3, wherein the diffusion barrier layer on the exposed conductive pattern is completely removed during the etching operation of the diffusion barrier layer.

5. The method according to claim 4, further comprising sequentially forming a seed layer and a copper plated layer on the semiconductor substrate having the recessed diffusion barrier layer.

6. The method according to claim 5, further comprising forming an adhesion layer before forming the seed layer.

7. The method according to claim 2, further comprising forming a seed layer using i-PVD technology, in which the processes of etching the diffusion barrier layer and forming the seed layer are concurrently performed.

8. The method according to claim 7, wherein the diffusion barrier layer on the exposed conductive pattern is completely removed while the diffusion barrier layer is etched.

9. The method according to claim 8, further comprising forming a copper plated layer on the semiconductor substrate having the seed layer.

10. The method according to claim 2, further comprising forming an adhesion layer using i-PVD technology, in which the processes of etching the diffusion barrier layer and forming the adhesion layer are concurrently performed.

11. The method according to claim 10, wherein the diffusion barrier layer on the exposed conductive pattern is completely removed while the diffusion barrier layer is etched.

12. The method according to claim 11, further comprising sequentially forming a seed layer and a copper plated layer on the semiconductor substrate having the adhesive layer.

13. The method according to claim 1, wherein the opening exposes an interface between the conductive pattern and the insulating layer such that a portion of the insulating layer is disposed on a bottom of the opening.

14. The method according to claim 13, wherein the recessed diffusion barrier layer is thicker in thickness on the insulating layer disposed on a bottom of the opening than on the exposed conductive pattern, and thicker in thickness on inner sidewalls of the opening than on the insulating layer disposed on the bottom of the opening.

15. The method according to claim 14, wherein the etching process of the diffusion barrier layer is performed using an RIE technology, or Ar plasma etching technology.

16. The method according to claim 15, wherein the diffusion barrier layer on the exposed conductive pattern is completely removed while the diffusion barrier layer is etched.

17. The method according to claim 16, further comprising sequentially forming a seed layer and a copper plated layer on the semiconductor substrate having the recessed diffusion barrier layer.

18. The method according to claim 17, further comprising forming an adhesion layer before forming the seed layer.

19. The method according to claim 14, further comprising forming a seed layer using i-PVD technology, in which the processes of etching the diffusion barrier layer and forming the seed layer are concurrently performed.

20. The method according to claim 19, wherein the diffusion barrier layer on the exposed conductive pattern is completely removed while the diffusion barrier layer is etched.

21. The method according to claim 20, further comprising forming a copper plated layer on the semiconductor substrate having the seed layer.

22. The method according to claim 14, further comprising forming an adhesion layer using i-PVD technology, in which the processes of etching the diffusion barrier layer and forming the adhesion layer are concurrently performed.

23. The method according to claim 22, wherein the diffusion barrier layer on the exposed conductive pattern is completely removed while the diffusion barrier layer is etched.

24. The method according to claim 23, further comprising sequentially forming a seed layer and a copper plated layer on the semiconductor substrate having the adhesive layer.

25. A semiconductor device comprising:
a semiconductor substrate;
a metal plug disposed on the semiconductor substrate;
a metal interconnect disposed on a top of the metal plug;
a first insulating layer at sidewalls of the metal plug, and extending and disposed between the metal interconnect and the semiconductor substrate;
a second insulating layer at sidewalls of the metal interconnect; and
a diffusion barrier layer disposed between the metal interconnect and the second insulating layer, between the metal interconnect and the first insulating layer, and between the metal interconnect and the metal plug, wherein the diffusion barrier layer interposed between the metal interconnect and the metal plug is of a thickness that is less than the thickness of the diffusion barrier layer interposed between the metal interconnect and the first insulating layer.

26. The semiconductor device according to claim 25, wherein the diffusion barrier layer interposed between the metal interconnect and the first insulating layer is thinner in thickness than the diffusion barrier layer interposed between the metal interconnect and the second insulating layer.

27. The semiconductor device according to claim 26, wherein the diffusion barrier layer interposed between the metal interconnect and the metal plug is discontinuous.

28. The semiconductor device according to claim 26, wherein the diffusion barrier layer interposed between the metal interconnect and the metal plug is continuous.

29. A semiconductor device comprising:
a semiconductor substrate;
a metal plug disposed on the semiconductor substrate;
a metal interconnect disposed on a top of the metal plug;
a first insulating layer at sidewalls of the metal plug, and extending and disposed between the metal interconnect and the semiconductor substrate;
a second insulating layer at sidewalls of the metal interconnect; and
a diffusion barrier layer disposed between the metal interconnect and the first insulating layer, and between the metal interconnect and the second insulating layer, wherein the diffusion barrier layer interposed between the metal interconnect and the first insulating layer is of a thickness that is less than the thickness of the diffusion barrier layer interposed between the metal interconnect and the second insulating layer.

30. The semiconductor device according to claim 29, wherein the diffusion barrier layer is not interposed between the metal interconnect and the metal plug.

31. The semiconductor device according to claim 30, wherein the metal interconnect includes copper.

32. The semiconductor device according to claim 31, wherein the diffusion barrier layer prevents copper atoms from being diffused from the metal interconnect to the first insulating layer or the second insulating layer.

33. A semiconductor device comprising:
a semiconductor substrate;
a lower interconnect disposed on the semiconductor substrate;
a first insulating layer at sidewalls of the lower interconnect;
a metal plug disposed on an interface between the lower interconnect and the first insulating layer;
a second insulating layer at sidewalls of the metal plug; and
a diffusion barrier layer disposed between the metal plug and the second insulating layer, between the metal plug and the first insulating layer, and between the metal plug and the lower interconnect, wherein the diffusion barrier layer interposed between the metal plug and the lower interconnect is of a thickness that is less than the thickness of the diffusion barrier layer interposed between the metal plug and the first insulating layer.

34. The semiconductor device according to claim 33, wherein the diffusion barrier layer interposed between the metal plug and the first insulating layer is thinner in thickness than the diffusion barrier layer interposed between the metal plug and the second insulating layer.

35. The semiconductor device according to claim 34, wherein the diffusion barrier layer interposed between the metal plug and the lower interconnect is discontinuous.

36. The semiconductor device according to claim 34, wherein the diffusion barrier layer interposed between the metal plug and the lower interconnect is continuous.

37. A semiconductor device comprising:
a semiconductor substrate;
a lower interconnect disposed on the semiconductor substrate;
a first insulating layer at sidewalls of the lower interconnect;
a metal plug disposed on an interface between the lower interconnect and the first insulating layer;
a second insulating layer at sidewalls of the metal plug; and
a diffusion barrier layer disposed between the metal plug and the second insulating layer, and between the metal plug and the first insulating layer, wherein the diffusion barrier layer, interposed between the metal plug and the first insulating layer is of a thickness that is less than the thickness of the diffusion barrier layer interposed between the metal plug and the second insulating layer.

38. The semiconductor to claim 37, wherein the diffusion barrier layer is not interposed between the lower interconnect and the metal plug.

39. The semiconductor device according to claim 38, wherein the metal plug includes copper.

40. The semiconductor device according to claim 39, wherein the diffusion barrier layer prevents copper atoms from being diffused from the metal plug to the first insulating layer or the second insulating layer.

* * * * *

UNITED STATES PATENT AND TRADEMARK OFFICE
CERTIFICATE OF CORRECTION

PATENT NO. : 7,335,590 B2 Page 1 of 1
APPLICATION NO. : 11/033189
DATED : February 26, 2008
INVENTOR(S) : Bong-Seok Suh et al.

It is certified that error appears in the above-identified patent and that said Letters Patent is hereby corrected as shown below:

Column 16, line 24 claim 3 delete "RIB" and insert --RIE--

Column 19, line 5 claim 38 insert --device according to-- after "semiconductor"

Signed and Sealed this

Nineteenth Day of August, 2008

JON W. DUDAS
*Director of the United States Patent and Trademark Office*